(12) United States Patent
Shi

(10) Patent No.: US 8,574,937 B2
(45) Date of Patent: Nov. 5, 2013

(54) HIGH EFFICIENCY ELECTROLUMINESCENT DEVICES AND METHODS FOR PRODUCING THE SAME

(75) Inventor: Yijian Shi, Mountain View, CA (US)

(73) Assignee: Sri International, Menlo Park, CA (US)

( * ) Notice: Subject to any disclaimer, the term of this patent is extended or adjusted under 35 U.S.C. 154(b) by 695 days.

(21) Appl. No.: 12/812,881

(22) PCT Filed: Jan. 24, 2008

(86) PCT No.: PCT/US2008/001025
§ 371 (c)(1),
(2), (4) Date: Oct. 11, 2010

(87) PCT Pub. No.: WO2009/093996
PCT Pub. Date: Jul. 30, 2009

(65) Prior Publication Data
US 2011/0042657 A1    Feb. 24, 2011

(51) Int. Cl.
*H01L 21/00* (2006.01)

(52) U.S. Cl.
USPC .. 438/29; 257/40; 257/E33.061; 257/E51.018

(58) Field of Classification Search
USPC ............... 257/40, E33.061, E51.018; 438/29
See application file for complete search history.

(56) References Cited

U.S. PATENT DOCUMENTS

| | | | |
|---|---|---|---|
| 4,539,507 A | 9/1985 | VanSlyke et al. | |
| 4,614,668 A | 9/1986 | Topp et al. | |
| 5,086,297 A | 2/1992 | Miyake et al. | |
| 5,247,190 A | 9/1993 | Friend et al. | |
| 5,442,256 A | 8/1995 | Moyer et al. | |
| 5,656,508 A | 8/1997 | So et al. | |
| 5,677,546 A | 10/1997 | Yu | |
| 5,682,043 A | 10/1997 | Pei et al. | |

(Continued)

FOREIGN PATENT DOCUMENTS

| | | |
|---|---|---|
| EP | 0776052 | 5/1997 |
| EP | 0878883 | 11/1998 |

(Continued)

OTHER PUBLICATIONS

Guo, Tzung-Fang, et al. "Organic Oxide/A1 Composite Cathode in Efficient Polymer Light-Emitting Diodes" Applied Physics Letters, AIP, American Institute of Physics, Melville, NY, 88(11):113501.

(Continued)

*Primary Examiner* — Marvin Payen
(74) *Attorney, Agent, or Firm* — Richard Aron Osman; Isaac M. Rutenberg

(57) ABSTRACT

Aspects of the disclosure include electroluminescent devices and methods for making the same. The devices include a substrate, a hole-injection electrode layer, an electroluminescent layer, and an electron-injection electrode layer, such as a layer that includes an air-stable, low work function material, which layer is capable of achieving efficient electron injection with reduced current leakage. In certain embodiments, the devices may contain an efficient electron injection layer that includes a composition comprising a polymer, e.g., a polymer that contains polar components (such as a polar functional group), and a metal diketonate. In certain embodiments, the devices may contain an electron injection layer that includes polyethylene glycol dimethyl ether and barium or calcium acetylacetonate. Methods of manufacturing such devices, for instance, employing a solution processing step for the deposition of an electron injection layer, as well as the use of the produced device(s) in electroluminescent displays is also provided herein.

25 Claims, 17 Drawing Sheets

(56) References Cited

U.S. PATENT DOCUMENTS

| | | | |
|---|---|---|---|
| 5,723,873 | A | 3/1998 | Yang |
| 5,807,627 | A | 9/1998 | Friend et al. |
| 5,869,350 | A | 2/1999 | Heeger et al. |
| 5,895,717 | A | 4/1999 | Cao et al. |
| 5,900,327 | A | 5/1999 | Pei et al. |
| 5,962,631 | A | 10/1999 | Woo et al. |
| 5,966,393 | A | 10/1999 | Hide et al. |
| 6,091,195 | A | 7/2000 | Forrest et al. |
| 6,326,936 | B1 | 12/2001 | Inganas et al. |
| 6,339,289 | B1 | 1/2002 | Fork |
| 6,414,104 | B1 | 7/2002 | Pei |
| 6,593,687 | B1 | 7/2003 | Pei et al. |
| 6,723,828 | B2 | 4/2004 | Pei |
| 6,800,722 | B2 | 10/2004 | Pei |
| 6,856,089 | B2 | 2/2005 | Hosakawa et al. |
| 6,998,773 | B2 | 2/2006 | Hosakawa et al. |
| 7,098,297 | B2 | 8/2006 | Pei |
| 7,423,371 | B2 | 9/2008 | Hosakawa et al. |
| 2001/0026124 | A1 | 10/2001 | Liu et al. |
| 2003/0218418 | A9 | 11/2003 | Sato et al. |
| 2006/0105201 | A1 | 5/2006 | Lee et al. |
| 2007/0031700 | A1 | 2/2007 | Guo et al. |
| 2008/0238310 | A1 | 10/2008 | Forrest et al. |
| 2008/0248240 | A1 | 10/2008 | Shi |
| 2008/0265757 | A1 | 10/2008 | Forrest et al. |
| 2009/0042142 | A1 | 2/2009 | Baldo et al. |

FOREIGN PATENT DOCUMENTS

| | | |
|---|---|---|
| EP | 0886329 | 12/1998 |
| EP | 0892028 | 1/1999 |
| EP | 0892590 | 1/1999 |
| EP | 1104939 | 6/2002 |
| EP | 1285957 | 2/2003 |
| EP | 1385219 | 1/2004 |
| GB | 2361355 | 10/2001 |
| WO | 9810473 | 3/1998 |
| WO | 9827136 | 6/1998 |
| WO | 9831057 | 7/1998 |
| WO | 9908325 | 2/1999 |
| WO | 2008060348 | 5/2008 |

OTHER PUBLICATIONS

Niu, Yu-Hua, et al. "High-Efficiancy Light-Emitting Diodes Using Neutral Surfactants and Aluminum Cathode" Applied Physics Letters, AIP, American Institute of Physics, Melville, NY, 86(8):83504.

PCT/ISA/220: International Search Report and the Written Opinion of the International Searching Authority, Jan. 24, 2008 for PCT/US2008/001025.

Baigent, et al. (1994) "Conjugated Polymer Light Emitting Diodes on Silicon Substrates" Appl. Phys. Lett. 65 (21):2636-2638.

Chang, et al. (1998) "Dual-Color Polymer Light-Emitting Pixels Processed by Hybrid Ink-Jet Printing" Applied Physics Letters 73(18):2561-2563 (abstract only printed from Chemical Abstracts 130:45177).

Franssila "Introduction to Microfabrication" (John Wiley & Sons, 2004).

Ghandhi "VLSI Fabrication Principles" (John Wiley & Sons, 2na ed. 1994).

Kaminorz, et al. (2000) "Characteristics of Polythiophene Surface Light Emitting Diodes" Synthetic Metals, 113 (1-2):103-114.

Merriam-Webster Collegiate Dictionary, tenth edition, 1997, p. 612.

Nyberg, et al. (2002) "Submicrometre Bridge Electrode Arrays for Light Emitting Polymer Diodes and Photodiodes" Nanotechnology, 13(2):205-211.

Nyberg, et al. (2002) "Macromolecular Nanoelectronics" Current Applied Physics, 2:27-31.

Pede, et al. (1998) "A General-Purpose Conjugated-Polymer Device Array for Imaging" Adv. Mater., 10(3):233-237.

Rost, et al. (1997) "Novel Light Emitting and Photoconducting Polyarylenevinylene Derivatives Containing Phenylene Arylamine and Phenylene Oxide Units in the Main Chain" Synthetic Metals 84(1-3):269-270.

Smela, et al. (1998) "Planar Microfabricated Polymer Light-Emitting Diodes" Semicond. Sci. Technol. 13(4):433-439.

Comparison of regular evaporation process (left) and angular (0° < α < 90°) evaporation process (right)

a) RGB color filter approach b) RGBW color filter approach

HIGH EFFICIENCY ELECTROLUMINESCENT DEVICES AND METHODS FOR PRODUCING THE SAME

BACKGROUND OF THE DISCLOSURE

Electroluminescent devices for use in electroluminescent displays, such as flat panel displays, are well known in the industry and are set forth in U.S. Pat. No. 5,247,190 to Friend et al.; U.S. Pat. No. 5,682,043 to Pei et al.; U.S. Pat. No. 5,723,873 to Yang; as well as Baigent et al. (1994), "Conjugated Polymer Light-Emitting Diodes on Silicon Substrates," Appl. Phys. Letter, 65(21):2636-38. Electroluminescent devices, therefore, may be fabricated upon a suitable substrate in a multilayer thin-film configuration, such as, for example, wherein a layer of electroluminescent material is positioned between an electron-injection and a hole-injection electrode layer in a "sandwich" configuration. When a voltage gradient is applied across the electrode layers, holes and electrons are injected into the electroluminescent material from the hole-injection and electron-injection electrode layers, respectively, which results in the emission of light through one or more of the electrode layers when the holes and electrons are combined in the electroluminescent material.

Commonly, electroluminescent devices for use in electroluminescent displays, such as those disclosed above, include a cathode and/or electron-injection layer that has been fabricated from a low work function metal, such as a calcium or barium metal. Low work function metals are typically used in the production of electroluminescent displays because they facilitate the injection of electrons into the electroluminescent material.

Using low work function metals, such as barium or calcium, as a cathode and/or electron-injection layer in electroluminescent devices, however, suffers from several drawbacks. For instance, one drawback is that low work function metals are typically very chemically reactive, unstable in air, and rapidly absorb moisture from the ambient environment thereby producing hydrogen gas and the corresponding metal hydroxide. This reaction results in a loss of the ability of the metal cathode and/or electron-injection layer to inject electrons into the electroluminescent material as the metal is oxidized, and consequently results in a loss of function of the electroluminescent device in which the low work function metal cathode/electron-injection layer is employed. Accordingly, in order for the device to have a reasonably long lifetime, these devices are traditionally fabricated and encapsulated in an inert, gas environment, which increases the complexity and expense of fabrication.

An additional drawback is that the deposition process by which the metal is deposited on a suitable substrate, so as to produce a low work function cathode layer and/or electron-injection layer, typically involves a high vacuum evaporation process. A high vacuum evaporation process is disadvantageous because the metal to be deposited must first be evaporated and then deposited in a vacuum, which process is complex, time consuming, and expensive.

SUMMARY OF THE DISCLOSURE

Aspects of the disclosure include electroluminescent devices and methods for making the same. In certain embodiments, the devices include a substrate, a hole-injection electrode layer, an electroluminescent layer, and an electron-injection electrode layer. In certain embodiments, the devices further include an anode and cathode layers. In certain embodiments, the devices may include a cavity and/or a dielectric layer. In certain embodiments, the electroluminescent devices contain an efficient electron-injection electrode layer, such as a layer that includes an air-stable, low work function material, which layer is capable of achieving efficient electron injection with reduced current leakage.

For instance, in certain embodiments, the devices may contain an efficient electron-injection layer that includes a composition comprising a polymer and a metal diketonate. In certain embodiments, a suitable polymer may be a polyethylene glycol dimethyl ether, polymethylene glycol, polymethylene oxide, polyethylene glycol, polyethylene oxide, polypropylene glycol, and the like. In certain embodiments, a suitable metal diketonate may be a metal acetylacetonate, such as lithium acetylacetonate, barium acetylacetonate, beryllium acetylacetonate, calcium, acetylacetonate, magnesium acetylacetonate, sodium acetylacetonate, potassium acetylacetonate, cesium acetylacetonate, strontium acetylacetonate, boron acetylacetonate, aluminum acetylacetonate, gallium acetylacetonate, indium acetylacetonate, silver acetylacetonate, and alloys thereof.

For example, in certain embodiments, the devices may contain an electron injection layer that includes polyethylene glycol dimethyl ether and barium or calcium acetylacetonate. Methods of manufacturing such devices, for instance, employing a solution processing step for the deposition of an electron-injection layer, as well as the use of the produced device(s) in electroluminescent displays is also provided herein.

An advantage of an electroluminescent device of the present disclosure is that, in certain embodiments, it includes an air-stable, low work function material, which material may be used as a cathode and/or electron injection layer. Additionally, an advantage of the present disclosure is that it provides methods for producing such devices that overcome the inherent limitations of prior fabrication processes, such as high vacuum deposition, and provides for a high-efficiency and bright display when employed in an electroluminescent display device.

BRIEF DESCRIPTION OF THE DRAWINGS

According to common practice, the various features of the drawings may not be drawn to-scale. Rather, the dimensions of the various features may be arbitrarily expanded or reduced for clarity. Included in the drawings are the following figures:

FIGS. 7A, 7B and 7C illustrate the formation of a layered structure on a substrate wherein the layered structure comprises an anode/hole-injection electrode layer and a dielectric layer. FIGS. 7D and 7E illustrate the formation of a cavity through the layered structure by using a lithographic and etching technique. FIG. 7F illustrates the application of an electroluminescent coating material to the interior surface of the cavity so as to achieve conformal contact between the coating material and the interior surface. FIG. 7E illustrates the deposition, e.g., via solution processing methods, of an electron-injection layer on top of the layered structure followed by the association of a separate cathode layer on top of the electron-injection layer.

FIGS. 8A and 8B illustrate the formation of a sacrificial member in the shape of a desired cavity for the layered structure. FIGS. 8C and 8D illustrate the formation of a layered structure on a substrate around the sacrificial member, wherein the layered structure comprises a substrate, a hole-injection electrode layer and a dielectric layer. FIG. 8E illustrates the removal of the sacrificial member to expose the interior surface of the cavity of the layered structure.

Figure 1:
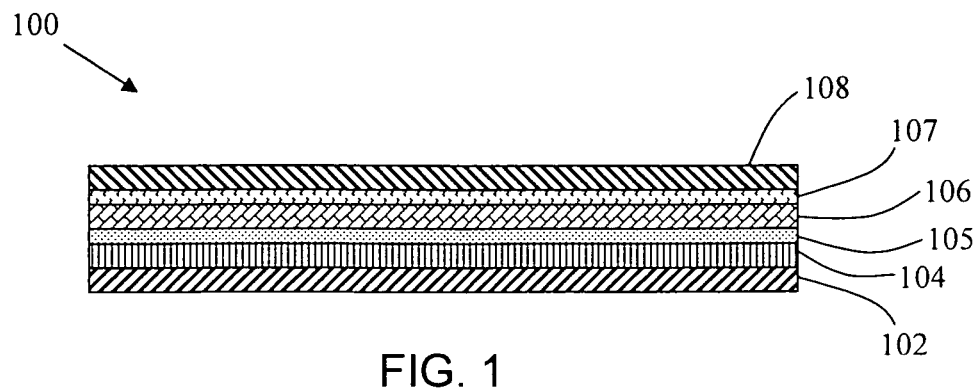
FIG. 1 schematically depicts an exemplary electroluminescent device in a "sandwich" configuration, wherein an anode layer has been deposited upon a substrate and the remainder of the device has been deposited atop the anode layer and below the cathode layer.

Before the present disclosure is further described, it is to be understood that this disclosure is not limited to particular embodiments described, as such may of course vary. It is also to be understood that the terminology used herein is for the purpose of describing particular embodiments only, and is not intended to be limiting. Unless defined otherwise, all technical and scientific terms used herein have the same meaning as commonly understood by one skilled in the art to which this disclosure belongs.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure.

Throughout this application, various publications, patents and published patent applications are cited. The disclosures of these publications, patents and published patent applications referenced in this application are hereby incorporated by reference in their entirety into the present disclosure. Citation herein by the Applicant of a publication, patent, or published patent application is not an admission by the Applicant of said publication, patent, or published patent application as prior art.

It must be noted that as used herein and in the appended claims, the singular forms "a", "and", and "the" include plural referents unless the context clearly dictates otherwise. Thus, for example, reference to "a layer" encompasses more than one layer, "a polymer" includes mixtures of different polymers, and the like. It is further noted that the claims may be drafted to exclude any optional element. As such, this statement is intended to serve as antecedent basis for use of such exclusive terminology as "solely", "only" and the like, in connection with the recitation of claim elements, or the use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order which is logically possible.

The term "array" used herein refers to a regular, orderly, and two-dimensional pattern of features such as cavities. Arrays typically but do not necessarily comprise at least about 100 and preferably at least about 1000 cavities.

The term "dielectric strength" is used herein to refer the ability of an electrically insulating material to withstand exposure to an electric field without electrical breakdown, i.e., loss of mechanical integrity. Dielectric strength is sometimes described as having two components, electronic and thermal. Electronic breakdown is caused by the excessive liberation of electrons and usually dominates the electrical breakdown process at a low temperature. Thermal breakdown, on the other hand, is caused by the localized heating due to material heterogeneities and dominates the electrical breakdown process at a higher temperature. Typically, dielectric strength is calculated in terms of volts per centimeter.

The term "electroluminescent" is used herein to describe a material or a device that emits electromagnetic radiation, preferably in the visible range, upon application of an electrical potential and/or current. When electrons and holes are injected into an electroluminescent material, light is emitted upon the combination of the electrons and holes, thereby resulting in electroluminescence.

The term "etchant" is used in its ordinary sense and refers to matter that is capable of chemically removing material from a solid body. An "isotropic etchant" is an etchant that removes material from a solid surface in a direction-invariant manner, whereas an "anisotropic etchant" preferentially removes material from a solid surface in a particular direction, e.g., according to crystallographic orientation of the solid body or the direction of the light energy particles for light assisted etching.

The term "electrical contact" is used herein to refer to a connection between two bodies that permits a flow of current, i.e., transfer of electrons or holes from one body to the other, which usually but does not necessarily imply direct mechanical contact between the two bodies.

The term "emission modifier" refers to a compound that alters the emission spectrum of an electroluminescent material. The emission modifier may be itself an electroluminescent or luminescent material.

"Optional" or "optionally" means that the subsequently described event or circumstance may or may not occur, and that the description includes instances where said event or circumstance occurs and instances where it does not. For example, an electroluminescent device comprising an "optional substrate" means that the substrate may or may not be present and that the description includes either state.

The term "substrate" is used herein in its ordinary sense and means a body or base layer onto which other layers are deposited. For instance, the term "substrate" refers to any type of base layer considered suitable for the manufacture of an electroluminescent device or larger system comprising electroluminescent devices. Specifically, a substrate is used to provide the layered structure of the disclosure sufficient mechanical strength for handling. Hence, the term may also refer to the substrate with the materials deposited on it during or after any of the various stages of treatment through which it goes during the process of electroluminescent device manufacture, for example during or after the deposition of a hole-injection layer, or the like.

In describing a substrate comprising multiple layers, reference is sometimes made to an "upper" layer, a "top" layer, or a "lower" layer. In general, an "upper" layer refers to one which is deposited after the layers described as lower. There is no intention to suggest by this terminology that the deposition must necessarily be done with the "upper" layer lying above the "lower" layer in the ordinary sense of being farther from the center of the earth. Similarly, when one speaks of depositing "atop" or "above" a substrate or a layer of a substrate, one means only that the deposited material is added to the side of the substrate to which material has previously been added. There is no implication that the deposition takes place with the material flowing downward in the ordinary sense of flowing towards the center of the earth. There is likewise no implication that no other material exists between layers A and B if layer A is described as being "above" layer B.

The term "transparent" here is to be construed as allowing an amount of light transmission which is appropriate in the circumstances. A transparent material need not be as transmissive as plate glass provided it is sufficiently transmissive for the application at hand. A transparent material may also allow only particular frequency ranges to pass through and block others, if the blocking is desired or is not a problem in the particular application. "Light" here should be understood to encompass infrared and ultraviolet radiation as well as visible light.

In describing molecular structures, e.g., of arylamine-substituted poly(arylene vinylenes) useful in conjunction with the disclosure, the following definitions apply:

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, 2-ethylhexyl, decyl, and the like, as well as cycloalkyl groups such as cyclopentyl, cyclohexyl and the like. Generally, although again not necessarily, alkyl groups herein contain 1 to about 12 carbon atoms. The term "lower alkyl" intends an alkyl group of one to six carbon atoms, preferably one to four carbon atoms. "Substituted alkyl" refers to alkyl substituted with one or more substituent groups, and the terms "heteroatom-containing alkyl" and "heteroalkyl" refer to alkyl in which at least one carbon atom is replaced with a heteroatom.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing one to six, more preferably one to four, carbon atoms.

The term "aryl" as used herein, and unless otherwise specified, refers to a univalent aromatic substituent containing a single aromatic ring or multiple aromatic rings that are fused together or linked covalently. Preferred aryl groups contain one aromatic ring or two fused or linked aromatic rings, e.g., phenyl, naphthyl, biphenyl, fluorenyl, and the like. "Substituted aryl" refers to an aryl moiety substituted with one or more substituent groups, and the terms "heteroatom-containing aryl" and "heteroaryl" refer to aryl in which at least one carbon atom is replaced with a heteroatom.

The term "arylene" as used herein, and unless otherwise specified, refers to a divalent aromatic substituent containing a single aromatic ring or multiple aromatic rings that are fused together or linked covalently. Preferred arylene groups contain one aromatic ring or two fused or linked aromatic rings. "Substituted arylene" refers to an arylene moiety substituted with one or more substituent groups, and the terms "heteroatom-containing arylene" and "heteroarylene" refer to arylene in which at least one carbon atom is replaced with a heteroatom.

The term "aralkyl" refers to an alkyl group with an aryl substituent, and the term "aralkylene" refers to an alkylene group with an aryl substituent; the term "alkaryl" refers to an aryl group that has an alkyl substituent, and the term "alkarylene" refers to an arylene group with an alkyl substituent.

The terms "halo" and "halogen" are used in the conventional sense to refer to a chloro, bromo, fluoro or iodo substituent. The terms "haloalkyl," "haloalkenyl" or "haloalkynyl" (or "halogenated alkyl," "halogenated alkenyl," "halogenated aromatic" or "halogenated alkynyl") refers to an alkyl, alkenyl, aromatic or alkynyl group, respectively, in which at least one of the hydrogen atoms in the group has been replaced with a halogen atom.

The term "heteroatom-containing" refers to a molecule or molecular fragment in which one or more carbon atoms is replaced with an atom other than carbon, e.g., nitrogen, oxygen, sulfur, phosphorus or silicon. Similarly, the term "heteroalkyl" refers to an alkyl substituent that is heteroatom-containing, the term "heterocyclic" refers to a cyclic substituent that is heteroatom-containing, the term "heteroaryl" refers to an aryl substituent that is heteroatom-containing, and the like.

"Hydrocarbyl" refers to univalent hydrocarbyl radicals containing 1 to about 30 carbon atoms, preferably 1 to about 24 carbon atoms, most preferably 1 to about 12 carbon atoms, including branched or unbranched, saturated or unsaturated species, such as alkyl groups, alkenyl groups, aryl groups, and the like. The term "lower hydrocarbyl" intends a hydrocarbyl group of one to six carbon atoms, preferably one to four carbon atoms. The term "hydrocarbylene" intends a divalent hydrocarbyl moiety containing 1 to about 30 carbon atoms, preferably 1 to about 24 carbon atoms, most preferably 1 to about 12 carbon atoms, including branched or unbranched, saturated or unsaturated species, or the like. The term "lower hydrocarbylene" intends a hydrocarbylene group of one to six carbon atoms, preferably one to four carbon atoms. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom. Similarly, "substituted hydrocarbylene" refers to hydrocarbylene substituted with one or more substituent groups, and the terms "heteroatom-containing hydrocarbylene" and "heterohydrocarbylene" refer to hydrocarbylene in which at least one carbon atom is replaced with a heteroatom.

A "Lewis acid" refers to any species with a vacant orbital, in contrast to a "Lewis base," which refers to a compound with an available pair of electrons, either unshared or in a .pi.-orbital. Typically, a Lewis acid refers to a compound containing an element that is two electrons short of having a complete valence shell.

By "substituted" as in "substituted hydrocarbyl," "substituted hydrocarbylene," "substituted alkyl," "substituted alkenyl" and the like, as alluded to in some of the aforementioned definitions, is meant that in the hydrocarbyl, hydrocarbylene, alkyl, alkenyl or other moiety, at least one hydrogen atom bound to a carbon atom is replaced with one or more substituents that are functional groups such as hydroxyl, alkoxy, thio, amino, halo, silyl, and the like. When the term "substituted" appears prior to a list of possible substituted groups, it is intended that the term apply to every member of that group. That is, the phrase "substituted alkyl, alkenyl and alkynyl" is to be interpreted as "substituted alkyl, substituted alkenyl and substituted alkynyl." Similarly, "optionally substituted alkyl, alkenyl and alkynyl" is to be interpreted as "optionally substituted alkyl, optionally substituted alkenyl and optionally substituted alkynyl."

Other definitions of basic organic chemical terms may be found in U.S. Pat. Nos. 6,593,687 and 7,098,297, which are incorporated herein by reference for the purpose of adopting those definitions.

Relevant information regarding the fabrication processes known to those of skill in the art can be found, for example, in Sami Franssila, Introduction to Microfabrication (John Wiley & Sons, 2004). Reference may also be made to Sorab K. Ghandhi, VLSI Fabrication Principles (John Wiley & Sons, 2d ed. 1994).

DETAILED DESCRIPTION

Aspects of the disclosure include electroluminescent devices and methods for making the same. In certain embodiments, the devices include a substrate, a hole-injection electrode layer, an electroluminescent layer, and an electron-injection electrode layer. In certain embodiments, the devices further include an anode and cathode layers. In certain embodiments, the devices may include a cavity and/or a dielectric layer. In certain embodiments, the electroluminescent devices contain an efficient electron-injection electrode layer, such as a layer that includes an air-stable, low work function material, which layer is capable of achieving efficient electron injection with reduced current leakage.

For instance, in certain embodiments, the devices may contain an efficient electron injection layer that includes a composition comprising a polymer and a metal diketonate. In certain embodiments, a suitable polymer containing at least one polar component may be one or more of polyethylene glycol dimethyl ether, polymethylene glycol, polymethylene oxide, polyethylene glycol, polyethylene oxide, polypropylene glycol, and the like. In certain embodiments, a suitable metal diketonate may be a metal acetylacetonate, such as lithium acetylacetonate, barium acetylacetonate, beryllium acetylacetonate, calciu, acetylacetonate, magnesium acetylacetonate, sodium acetylacetonate, potassium acetylacetonate, cesium acetylacetonate, strontium acetylacetonate, boron acetylacetonate, aluminum acetylacetonate, gallium acetylacetonate, indium acetylacetonate, silver acetylacetonate, and alloys thereof.

For example, in certain embodiments, the devices may contain an electron-injection layer that includes polyethylene glycol dimethyl ether and barium or calcium acetylacetonate. Methods of manufacturing such devices, for instance, employing a solution processing step for the deposition of an electron-injection layer, as well as the use of the produced device(s) in electroluminescent displays is also provided herein.

The subject electroluminescent devices will be described first, followed by a description of the methods for fabricating such devices, as well as their representative use in the production of electroluminescent (e.g., flat panel) displays.

Electroluminescent Devices

As summarized above, an aspect of the subject disclosure is an electroluminescent device. In certain embodiments, the electroluminescent device includes a substrate. The term "substrate" is used herein in its ordinary sense and means a body or base layer onto which other layers may be deposited. Any suitable substrate may be employed so long as it is of sufficient mechanical strength to be used as a base upon which the layered structure of the disclosure can be provided.

Accordingly, the substrate may be comprised of any of a number of materials well known in the art depending on the desired use for which the electroluminescent device is to be employed. For example, in certain embodiments, radiation generated by the combining of holes and electrons in the electroluminescent material results in the generation of electromagnetic radiation (e.g., light) that is to be emitted and transmitted through the substrate. Hence, in certain embodiments, the substrate may be transparent or semi-transparent to the emitted radiation.

Various silicon, ceramic and polymeric materials have sufficient optical transparency for transmitting visible emitted radiation. Hence, a suitable substrate for use with the subject disclosure may be a transparent or semi-transparent base material that includes silicon, a ceramic, plastic(s) and/or a polymeric material.

Suitable substrate materials may be crystalline or amorphous. Suitable silicon derived materials include, but are not limited to silicon dioxide, various silicon-based glasses, such as soda-lime glass and borosilicate glass. Suitable transparent or semi-transparent ceramics include, but are not limited to, aluminum oxide, zirconium oxide, sodium chloride, diamond, and/or the like. Examples of transparent or semi-transparent polymeric materials for transmitting emitted radiation include, but are not limited to, polyethylenenaphthalate, polycarbonate, polyethylene, polypropylene, polyester, polyimide, polyamides, polyacrylates and polymethacrylates.

The substrate may be rigid or flexible and may be of any suitable shape and configuration. Accordingly, in certain embodiments, a flexible polymeric substrate is provided. Optionally, an insulating layer may be included between the substrate and/or one or more of the other layers of the subject device. Further, the substrate may be detachable from the layered structure of the device. Additionally, in certain embodiments, the substrate may include a semiconductor material, such as silicon, and may additionally contain microcircuitry, in which case, the electroluminescent device may comprise an integrated portion of a microcircuitry-driven device.

In certain embodiments, the electroluminescent device includes an electrode layer positioned above the substrate. In certain embodiments, the electrode layer is positioned directly or indirectly above the substrate. By "directly above" is meant that the electrode layer is directly above and actually in contact with the substrate. By "indirectly above" is meant that the electrode layer is not directly above and may not actually be in contact with the substrate, rather an intervening layer or coating (e.g., an insulating layer) may separate the electrode layer from the substrate. For instance, the electrode layer may be positioned directly above the substrate, such that the electrode layer comes into direct contact with the substrate, or an intermediary layer (e.g., a barrier layer) may be interposed between the substrate and the electrode layer. For example, where the substrate is plastic, one or more barrier layers may be positioned at least partially or fully between the substrate and the electrode layer. Such an intermediary layer may or may not continue along the entire length of the substrate and/or electrode layer.

In certain embodiments, the electrode layer positioned above the substrate is an anode layer. In certain embodiments, the anode layer includes a hole-injection electrode layer. In certain embodiments, the hole-injection electrode layer may be the anode layer or may be a separate layer that may be directly associated (e.g., in contact with) the anode layer. Accordingly, in certain embodiments, the anode layer is in direct contact with the substrate and in direct contact with a hole-injection layer. In certain embodiments, the anode layer is in contact with the substrate, a dielectric layer is positioned partially above the anode layer, and a hole-injection layer is also positioned partially above the anode and/or the dielectric layer, for instance, where the hole-injection layer directly coats the dielectric layer and directly coats the anode layer where a cavity is present in the dielectric layer thereby exposing the anode layer, which anode layer the dielectric layer partially covers. In certain embodiments, a hole-transport layer is also included, for instance, a hole-transport layer may be a layer that is positioned to be in contact with a hole-injection layer, which hole-injection layer may be positioned to be in contact with an anode layer.

In certain embodiments, the electrode layer that is positioned above the substrate is a cathode layer. In certain embodiments, the cathode layer includes an electron-injection layer. The electron-injection layer may typically be a separate layer that may be associated (e.g., in contact with) the cathode layer. Accordingly, in certain embodiments, the cathode layer is in direct contact with the substrate and in direct contact with an electron-injection layer. In certain embodiments, the cathode layer is in contact with the substrate, a dielectric layer is positioned partially above the cathode layer, and an electron-injection layer is also positioned partially above the cathode and/or dielectric layer, for instance, where the electron-injection layer directly coats the dielectric layer and directly coats the cathode layer where a cavity is present in the dielectric layer thereby exposing the cathode layer, which layer the dielectric layer partially covers. In certain embodiments, an electron-transport layer is also included, for instance, an electron-transport layer may be a layer that is positioned to be in contact with a electron-injection layer, which electron-injection layer may be positioned to be in contact with a cathode layer.

Accordingly, whenever a hole-injection electrode layer is referenced, the referent may include a hole-injection layer and an anode layer (which may or may not be the same element), dependent on the configuration of the overall device.

In certain embodiments, a hole-injection electrode layer (e.g., which may include or be the same as an anode layer) is positioned above the substrate. The hole-injection electrode layer may be composed of any suitable material capable of injecting holes into an associated material, for instance, an electroluminescent material. For example, various metallic, polymeric, ceramic and semiconducting materials may be capable of injecting holes into an associated electroluminescent material that is in contact with the hole-injection electrode layer. In certain embodiments, the hole-injection electrode layer includes a metallic material, for instance, a material with a high electrical conductivity. In certain embodiments, the hole-injection electrode layer includes a high work function material.

In certain embodiments, the anode and/or hole-injection layer includes a metal such as gold or copper or other such metallic material with a high conductivity and chemical inertness with respect to the other components of the electroluminescent device. Other metals and/or other materials suitable for use as an anode and/or hole-injection electrode material include, but are not limited to, nickel, palladium, platinum, chromium, molybdenum, tungsten, manganese, nickel, cobalt, metal oxides and combinations and alloys thereof, as well as fullerenes, carbon nano-tubes. For instance, where the bottom electrode layer may be an anode layer, the anode may include indium tin oxide (ITO).

In certain embodiments, the anode and/or hole-injection layer may include a conductive polymeric material, a small molecular organic, and/or inorganic layer. For instance, the hole-injection electrode layer may include an anode layer as well as a hole transport layer. Accordingly, the hole-injection electrode layer may include a polymeric material such as, but not limited to: polyaniline, polypyrrole and poly(3,4-ethylenedioxy-2,5-thiophene), triphenylamine, tetra-N-phenyl-benzidine, N,N'-Di-[(1-naphthyl)-N,N'-diphenyl]-1,1'-biphenyl)-4,4'-diamine, and their derivatives and analogs. In addition, certain ceramic materials such as conductive chalcogenides, e.g., metal oxides, mixed metal oxides and metal sulfides as well as mixed metal sulfides may also be suitable. Accordingly, in certain embodiments, the hole-injection electrode layer may be the electrode layer itself, and in other embodiments, the hole-injection layer may be an electrode layer (electrical conduction layer) plus a layer of organic (either small molecule or conductive polymer).

In certain embodiments, the electrode layer is constructed as a laminate, composite or mixture of materials. Additionally, the electrode layer may have a thickness of about 200 to about 10,000 angstroms, for instance, about 400 to about 5000 angstroms, such as about 1000 to about 2000 angstroms.

In certain embodiments, the electrode layer positioned above the substrate is a cathode layer. In certain embodiments, the cathode layer includes an electron-injection layer. In certain embodiments, the electron-injection electrode layer may be a separate layer that may be directly associated (e.g., in contact with) the cathode layer. Accordingly, in certain embodiments, the electroluminescent device includes a cathode layer and an electron-injection layer that is positioned above the substrate. In certain embodiments, the cathode and electron-injection electrode layer is positioned above the substrate and above the anode and/or hole-injection electrode layer, and may also be positioned above an electroluminescent layer and/or a dielectric layer (if included), as described below.

Hence, in certain embodiments, the cathode and electron-injection layer may be positioned directly or indirectly above an electroluminescent layer. By "directly above" is meant that the cathode and/or electron-injection electrode layer is directly above and actually in contact with a electroluminescent layer. By "indirectly above" is meant that the cathode and/or electron-injection electrode layer is not directly above and may not actually be in direct contact with an electroluminescent layer, rather an intervening layer, such as an electron transport layer, may at least partially separate the cathode and electron-injection layer from the electroluminescent layer.

Additionally, in certain embodiments, for instance, where a dielectric layer is included, the cathode and electron-injection electrode layer may be positioned directly or indirectly above a dielectric layer. By "directly above" is meant that the cathode and/or electron-injection electrode layer is directly above and actually in contact with a dielectric layer. By "indirectly above" is meant that the cathode and/or electron-injection electrode layer is not directly above and may not actually be in contact with a dielectric layer, rather an intervening layer or coating may separate the cathode and/or electron-injection electrode layer from the dielectric layer, for instance, a barrier layer may be included. In certain embodiments, the cathode and electron-injection layers are positioned above the substrate, an electroluminescent and/or dielectric layer is positioned above the cathode and electron-injection layers, and a hole-injection/anode layer is positioned directly or indirectly above the electroluminescent and/or dielectric layer.

The cathode layer may be composed of any suitable material capable of allowing a current to flow through it. For example, various metallic, polymeric, ceramic and semiconducting materials may be capable of allowing a current to flow through the material and may, therefore, be used as a cathode. A suitable metal for use as a cathode includes any suitable conducting metal, such as Li, Al, Mg, Ag, Cu, Au, or the like, and/or may be an alloy thereof, such as a Li—Al or Mg—Ag alloy.

The electron-injection electrode layer may be composed of any suitable efficient, low work function material that is both air stable and capable of injecting electrons into an associated electroluminescent material. For instance, in certain embodiments, an efficient electron-injection layer may be a composition that includes both a compound containing a low work function metal element and a polymer composition wherein the compound containing the low work function metal may be evenly and uniformly distributed in the polymer composition. For example, a suitable compound containing a low work function metal may include a metal ion containing compound material or organometallic compound, dissolved in a suitable solvent, which is then dispersed in a suitable polymer composition.

In certain embodiments, an efficient electron-injection layer may be a composition that includes a polymer, for instance, a polymer that contains one or more polar components (such as a polar functional group), and a compound containing a low work function metal, such as metal diketonate. In certain embodiments, a suitable polymer, e.g., a polymer containing at least one polar component, may be any polymer, e.g., any polymer that contains a polar group, and is capable of receiving and distributing a compound containing a low work function metal, such as metal diketonate, throughout the polymer composition. In certain embodiments, a suitable polymer, e.g., a polymer containing at least one polar component, may be polyethylene glycol dimethyl ether or other polyether, such as polymethylene glycol, polymethylene oxide, polyethylene glycol, polyethylene oxide, polypropylene glycol, polypropylene oxide, polybutylene glycol, polybutylene oxide, or one or more derivatives thereof, and the like.

In certain embodiments, a suitable compound containing a low work function metal element may include a metal diketonate. A suitable metal diketonate may be any metal diketonate capable of being associated with a composition containing a suitable polymer, e.g., a polymer containing a polar group, and being distributed (e.g., uniformly) therein. In certain embodiments, a suitable metal diketonate may be a metal acetylacetonate, such as lithium acetylacetonate, barium acetylacetonate, beryllium acetylacetonate, calcium acetylacetonate, magnesium acetylacetonate, sodium acetylacetonate, potassium acetylacetonate, cesium acetylacetonate, strontium acetylacetonate, boron acetylacetonate, aluminum acetylacetonate, gallium acetylacetonate, indium acetylacetonate, silver acetylacetonate, and alloys thereof. In certain embodiments, the compound containing a low work function metal element, includes a suitable solvent. For example, the compound may include a metal diketonate, which is mixed with and/or otherwise dissolved or dispersed in a suitable solvent, such as 2-ethoxyethanol, tetrahydrofuran, 3-hydroxytetrahydrofuran, 3-hydroxydihydro-2(3H)-furanone, acetonitrile, ethyl hydroxyacetate, 2-propoxyethanol, 2-isopropoxyethanol, diethylene glycol.

In certain embodiments, a suitable electron-injection layer includes a polyethylene glycol dimethyl ether and barium or calcium acetylacetonate.

In certain embodiments, the cathode and electron-injection electrode layer is constructed as a laminate, composite or mixture of materials. Additionally, the cathode and electron-injection electrode layer may have a thickness of about 200 to about 10,000 angstroms, for instance, about 400 to about 5000 angstroms, such as about 1000 to about 2000 angstroms. In certain embodiments, the cathode and electron-injection electrode layer is a composite of two layers, such as a thin electron injection layer of about 10 to about 200 angstroms of an air-stable, low work function material, such as those described above, e.g., polyethylene glycol dimethyl ether metal diketonate, that may be in contact with an electroluminescent material and/or a dielectric layer, and a thicker top layer (e.g., cathode layer) of a conductive metal, such as silver or aluminum. In certain embodiments, the cathode/electron-injection electrode layer is configured for directing light through the substrate.

In certain embodiments, the electroluminescent device includes an electroluminescent material, for example, an electroluminescent layer, which layer may at least partially separate a anode/hole-injection layer from a cathode/electron-injection layer. For instance, in certain embodiments, as will be described in greater detail below, a device of the disclosure may include an anode and/or hole-injection layer that is separated from an electron-injection and cathode layer by an electroluminescent material layer (e.g., the electroluminescent material is sandwiched between the anode and/or hole-injection layer and the electron-injection and cathode layers). See FIG. 1.

In certain embodiments, as will be described in greater detail below, the device may include a cavity and the electroluminescent material may be positioned at least partially in the cavity of the device. For instance, in certain embodiments, the electroluminescent material may substantially or totally fill a cavity of the device. In certain embodiments, the electroluminescent material may form an extended layer, for instance, the electroluminescent material may not only fill the dimensions of the cavity but may also form an additional layer that separates the electrode layers from each other and/ or a dielectric layer from one or more electrode layers. See FIGS. 2-6.

The electroluminescent material may be composed of any suitable material capable of receiving a hole from the hole-injection/anode electrode layer and an electron from the electron-injection/cathode electrode layer and emitting electromagnetic radiation (e.g., light) when the injected holes and electrons combine. Accordingly, in certain embodiments, the electroluminescent material may include any of a number of organic or inorganic compounds or mixtures thereof, such as multi-layers of organics or small molecules or the like.

For instance, the electroluminescent layer may include a polymeric material or be composed of one or more small molecule materials, and the material may contain at least one electroluminescent compound, for instance, an organic, inorganic or small molecule electroluminescent compound. In certain embodiments, the electroluminescent compound may include a simple organic molecule or complex polymer or copolymer. For example, a simple organic luminescent molecule may include tris(8-hydroxyquinolinato)-aluminum or perylene.

In certain embodiments, the electroluminescent material includes a polymer or copolymer. The molecular structure of a suitable polymer or copolymer may include a carbon-based or silicon-based backbone. The polymers and copolymers may be linear, branched, crosslinked or any combinations thereof, and may have a wide range of molecular weights from as low as about 5000 to more than 1,000,000. In the case of copolymers, the copolymers may be alternating, block, random, graft copolymers, or combinations thereof. Examples of suitable electroluminescent polymers useful in conjunction with the present disclosure include, but are not limited to, conjugated polymers such as, polyparaphenylenes, polythiophenes, polyphenylenevinylenes, polythienylvinylenes, polyfluorenes, 1,3,4-oxadiazole-containing polymers, and various derivatives and copolymers thereof.

An exemplary electroluminescent polymer is an arylamine-substituted poly(arylene-vinylene) polymer that has the general structure of formula (I) below:

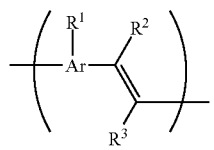

wherein: Ar is arylene, heteroarylene, substituted arylene or substituted heteroarylene containing one to three aromatic rings;

$R^1$ is the arylamine substituent and is of the formula —$Ar^1$—$N(R^4R^5)$ wherein $Ar^1$ is as defined for Ar and $R^4$ and $R^5$ are independently hydrocarbyl, substituted hydrocarbyl, heteroatom-containing hydrocarbyl, or substituted heteroatom-containing hydrocarbyl; and $R^2$ and $R^3$ are independently selected from the group consisting of hydrido, halo, cyano, hydrocarbyl, substituted hydrocarbyl, heteroatom-containing hydrocarbyl, and substituted heteroatom-containing hydrocarbyl, or $R^2$ and $R^3$ may together form a triple bond.

Other moieties may be as follows:

Ar may be a five-membered or six-membered arylene, heteroarylene, substituted arylene or substituted heteroarylene group, or may contain one to three such groups, either fused or linked. Preferably, Ar is comprised of one or two aromatic rings, and is most preferably comprised of a single aromatic ring that is five-membered or six-membered arylene, heteroarylene, substituted arylene or substituted heteroarylene. $Ar^1$, the arylene linking moiety in the arylamine substituent, is defined in the same way.

The substituents $R^2$ and $R^3$ are generally hydrido but may also be halo (particularly chloro or fluoro) or cyano, or substituted or unsubstituted alkyl, alkoxy, alkenyl, alkynyl, aryl and heteroaryl.

$R^4$ and $R^5$ may the same or different and, as noted, are hydrocarbyl, substituted hydrocarbyl, heteroatom-containing hydrocarbyl, or substituted heteroatom-containing hydrocarbyl. For example, $R^4$ and $R^5$ may be alkyl, alkoxy-substituted alkyl, polyether-substituted alkyl, nitro-substituted alkyl, halo-substituted alkyl, aryl, alkoxy-substituted aryl, polyether-substituted aryl, nitro-substituted aryl, halo-substituted aryl, heteroaryl, alkoxy-substituted heteroaryl, polyether-substituted heteroaryl, nitro-substituted heteroaryl, halo-substituted heteroaryl, and the like. In certain embodiments the substituents are aryl, e.g., phenyl, alkoxy-substituted phenyl (particularly lower alkoxy-substituted phenyl such as methoxyphenyl), polyether-substituted phenyl (particularly phenyl substituted with a —$CH_2$ ($OCH_2CH_2)_nOCH_3$ or —$(OCH_2CH_2)_2OCH_3$ group where n is generally 1 to 12, preferably 1 to 6, most preferably 1 to 3), and halo-substituted phenyl (particularly fluorinated or chlorinated phenyl).

Another exemplary electroluminescent polymer material that is described in U.S. Pat. No. 6,414,104, is an arylamine-substituted poly(arylene-vinylene) polymer that contains monomer units having the general structure of formula (II) as follows:

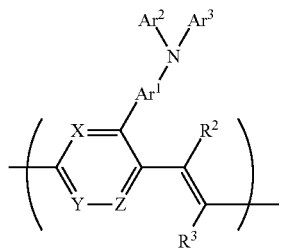

Wherein: X, Y and Z are independently selected from the group consisting of N, CH and $CR^6$ wherein $R^6$ is halo, cyano, alkyl, substituted alkyl, heteroatom-containing alkyl, aryl, heteroaryl, substituted aryl, or substituted heteroaryl, or wherein two $R^6$ moieties on adjacent carbon atoms may be linked to form an additional cyclic group;

$Ar^1$ is as defined above;

$Ar^2$ and $Ar^3$ are independently selected from the group consisting of aryl, heteroaryl, substituted aryl and substituted heteroaryl containing one or two aromatic rings; and $R^2$ and $R^3$ are as defined above.

In formula (I) above, the polymer is a poly(phenylene vinylene) derivative when X, Y and Z are all CH. When at least one of X, Y and Z is N, the aromatic ring will be, for example, substituted or unsubstituted pyridinyl, pyridazinyl, pyrimidinyl, pyrazinyl, 1,2,4-triazinyl, or 1,2,3-triazinyl. For instance, one of X, Y and Z may be CH and the other two may be either CH or $CR^6$, wherein $R^6$ may be a heteroatom-containing alkyl, for instance, alkoxy, or a polyether substituent —$CH_2(OCH_2CH_2)_nOCH_3$ or —$(OCH_2CH_2)_nOCH_3$ group where n is may be 1 to 12, for instance, 1 to 6, such as 1 to 3.

The polymer may be a homopolymer or a copolymer with at least one additional type of monomer unit. Preferably, if the polymer is a copolymer, the additional monomer units are also arylene-vinylene monomer units, for example having the structure of Formula (III):

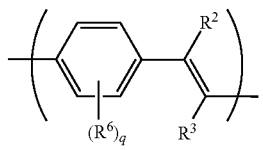

wherein $R^2$, $R^3$ and $R^6$ are as defined previously and q is an integer in the range of zero to 4 inclusive.

Examples of specific polymers having the structure of formula (I) are poly(2-(4-diphenylamino-phenyl)-1,4-phenylene vinylene and poly(2-(3-diphenylaminophenyl)-1,4-phenylene vinylene.

Examples of specific polymers disclosed in U.S. Pat. No. 6,414,104 are poly(2-(4-diphenylamino-phenyl)-1,4-phenylene vinylene and poly(2-(3-diphenylaminophenyl)-1,4-phenylene vinylene.

Electroluminescent polymers appropriate for use in this disclosure are also described in U.S. Pat. Nos. 6,723,828, 6,800,722, and 7,098,297, both of which are incorporated by reference herein. In those referenced patents there is disclosed a conjugated polymer containing monomer units having the structure of formula (IV):

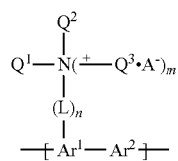

Wherein: $Ar^1$ and $Ar^2$ are independently selected from the group consisting of monocyclic, bicyclic and polycyclic arylene, heteroarylene, substituted arylene and substituted heteroarylene groups;

L is alkylene, alkenylene, substituted alkylene, substituted alkenylene, heteroalkylene, heteroalkenylene, substituted heteroalkylene, substituted heteroalkenylene, arylene, heteroarylene, substituted arylene or substituted heteroarylene;

m is zero or 1;

n is zero or 1;

$Q^1$ and $Q^2$ are independently selected from the group consisting of H, aryl, heteroaryl, substituted aryl, substituted heteroaryl, alkyl, and substituted alkyl, and $Q^3$ is selected from the group consisting of alkyl and substituted alkyl, with the proviso that when m is 1, $Q^1$ and $Q^2$ are other than H; and $A^-$ is a negatively charged counterion.

The electroluminescent material may also include blends of polymers within formula (IV) with other polymers, as well as a variety of copolymers.

In certain embodiments, the electroluminescent device may be formulated in a multilayer format such as in a sandwich configuration containing multiple layers. For instance, the electroluminescent device may include a substrate, an anode and/or hole-injection layer, an electroluminescent material layer, and an electron-injection and/or cathode layer. In certain embodiments, the electroluminescent device may be formulated in a multilayer format and also may include a cavity, such as a cavity that extends through one or more of an electrode layer, for instance, an anode/hole-injection or electron-injection/cathode layer and may additionally extend through a dielectric layer (if present).

Accordingly, in certain embodiments, the electroluminescent device may include a dielectric layer. A suitable dielectric layer may be positioned above an electrode layer, such as the anode and/or the hole-injection layer, but below the electron-injection and/or cathode layer, or a suitable dielectric layer may be positioned above an electron-injection and/or cathode layer, but below the hole-injection and/or anode layer.

In certain embodiments, the dielectric layer is positioned directly or indirectly above an electrode layer, such as the hole-injection electrode layer. By "directly above" is meant that the dielectric layer is directly above and actually in contact with the electrode layer (e.g., hole-injection electrode layer). By "indirectly above" is meant that the dielectric layer is not directly above and may not actually be in contact with the electrode layer (e.g., hole-injection layer), rather an intervening layer or coating may separate at least a portion of the dielectric layer from the electrode layer.

In certain embodiments, the dielectric layer is positioned directly or indirectly below an electrode layer, such as the electron-injection/cathode electrode layer. By "directly below" is meant that the dielectric layer is directly below and actually in contact with the electrode layer (e.g., electron-injection layer). By "indirectly below" is meant that the dielectric layer is not directly below and may not actually be in contact with the electrode layer (e.g., electron-injection electrode layer), rather an intervening layer or coating may separate the dielectric layer from the electrode layer.

The dielectric layer may be composed of any suitable material capable of serving as a barrier between the electrode layers to provide an electrical barrier and to prevent electrical shorting between the electrode layers. Accordingly, in certain embodiments, the dielectric layer is substantially pinhole free and composed from a high-resistivity material having an electrical resistivity no less than about $10^8$ ohm-cm, preferably no less than about $10^{12}$ ohm-cm. Suitable high-resistivity materials include, but are not limited to, silicon nitride, boron nitride, aluminum nitride, silicon oxide, titanium oxide, aluminum oxide, polyimide, polyvinylidene fluoride, paralene, as well as various sol-gel materials and pre-ceramic polymers.

In certain embodiments, the dielectric layer is configured for increasing electroluminescent efficiency and decreasing power consumption. Accordingly, in certain embodiments, the dielectric layer is thin. For instance, in certain embodiments, the term "thin" means that the dielectric layer is capable of reducing the distance between the electrodes and therefore reducing the voltage needed to generate electroluminescence. Specifically, in certain embodiments, the dielectric layer does not exceed about 1 micrometer in thickness. For instance, in certain embodiments, the dielectric layer may have a thickness of about 100 to about 5000 angstroms, for instance, about 500 to about 2000 angstroms. In certain embodiments, the dielectric layer exceeds 100 nms, exceeds 120, exceeds 150, or exceeds 200 nm in thickness.

However, it is to be noted that in certain situations dielectric materials may break down if excessive voltage is applied. Hence, a suitable dielectric material for use in an electroluminescent device of the subject disclosure has sufficient dielectric strength for its thickness to withstand the operating voltage required for an electroluminescent material to emit photons when an operating voltage is applied between a anode/hole-injection and an electron-injection/cathode electrode layers that are separated from one another by the dielectric layer and in contact with an electroluminescent material. Accordingly, the dielectric material layer may have a sufficient dielectric strength for its thickness to withstand at least about 2 volts over the operating voltage. For example, if the device is constructed to emit light when a 5-volt potential is applied, the dielectric layer should be able to withstand at least about 7 volts.

As set forth above, in certain embodiments, the device may include a cavity. In certain embodiments, the cavity extends at least partially through one or more layers of the various components of the device. For instance, in certain embodiments, the cavity may extend through both a dielectric layer and the bottom most electrode layer (e.g., with respect to the substrate). In certain embodiments, the device includes a cavity that extends through a dielectric layer but does not extend through the electrode layers. In such embodiments, the bottom most electrode layer (e.g., the anode/hole-injection or electron-injection/cathode electrode layer) comprises a material that is at least semi-transparent to electro-chemical radiation (e.g., light).

In certain embodiments, the device includes a cavity that is at least partially bounded by one or more of a substrate, an anode/hole-injection electrode layer, a dielectric layer, and an electron-injection/cathode electrode layer. For instance, in certain embodiments, the cavity may be bounded by an anode and/or hole-injection layer and an electron-injection and cathode layer and may further be at least partially bounded by a portion of a dielectric material layer (if included) and/or the substrate or a material coating the substrate.

For example, in certain embodiments, the device includes a cavity that is bounded by a portion of a substrate, an anode and/or hole-injection layer, a dielectric layer, and an electron-injection and/cathode layer. In certain embodiments, the device includes a cavity that is bounded by a portion of a hole-injection and/or anode layer, a dielectric layer, and an electron-injection and/or cathode layer. In certain embodiments, the device includes a cavity that is bounded by a portion of a substrate, a hole-injection electrode and/or anode layer, and an electron-injection layer.

In certain embodiments, the cavity includes a lumen and an electroluminescent layer, such as that described above, which is positioned within the lumen of the cavity. In certain embodiments, the cavity may be filled with a material, such as an electroluminescent material. In certain embodiments, the fill material, e.g., electroluminescent material, entirely fills the dimensions of the cavity, but does not over-flow beyond the dimensions of the cavity, nor is the material substantially present between the cavity and an electrode layer, such as the electron-injection/cathode electrode layers, in such a manner that it would be considered an intervening layer between the cavity and the electrode layer (e.g., the electron-injection/ cathode electrode layers). In certain embodiments, the fill material, e.g., electroluminescent material, entirely fills the dimensions of the cavity and over-flows beyond the dimensions of the cavity so as to form a material layer that is present between the cavity and an electrode layer, such as an electron-injection/cathode electrode layers, in such a manner that it would be considered an intervening layer between the cavity and the electrode layer (e.g., the electron-injection electrode/ cathode layers).

In certain embodiments, the cavity does not extend through one or more electrode layers, such as the electron-injection and/or cathode layer. Rather, in certain embodiments, the electrode layer (e.g., electron-injection and cathode layers) may at least partially bound the cavity on one or more sides. For instance, in certain embodiments, the electrode layer (e.g., electron-injection and cathode layers) is positioned above the cavity and its length spans across the cavity (e.g., laterally). In certain embodiments, the electrode layer (e.g., electron-injection and cathode layers) bounds the cavity, however, the electroluminescent material which fills the cavity over-flows beyond the dimensions of the cavity and forms a material layer that is present between the cavity and the electrode layer (e.g., electron-injection and cathode layers). In certain embodiments, the electrode layer (e.g., electron-injection and cathode layers) bounds the cavity and the electroluminescent material, which at least partially fills the cavity, does not over-flow beyond the dimensions of the cavity nor does it form a material layer between the cavity and the electrode layer (e.g., electron-injection and cathode layers).

Accordingly, as can be seen with reference to the above, the cavity may be bounded by various portions of the components of the electroluminescent device. Hence, the various surfaces of the portions of the components of the electroluminescent device which bound the cavity are herein referenced as being "internal surfaces of the cavity." Accordingly, the electroluminescent layer positioned within the cavity may contact one or more of a substrate, a material coating the substrate, a hole-injection and/or anode layer, a dielectric layer, and a electron-injection and/or cathode layer.

For instance, in certain embodiments, an electroluminescent layer positioned within the cavity contacts a surface of the substrate, an anode layer and/or a hole-injection layer, a dielectric layer, an electron-injection layer and/or a cathode layer. In certain embodiments, an electroluminescent layer positioned within the cavity contacts an anode layer and/or a hole-injection layer, a dielectric layer, and an electron-injection layer. For instance, in certain embodiments, the electroluminescent layer positioned within the cavity, does not contact the substrate. In certain embodiments, an electroluminescent layer positioned within the cavity contacts an anode layer and/or a hole-injection electrode layer and a electron-injection electrode and cathode layer. For instance, in certain embodiments, the electroluminescent layer positioned within the cavity, does not contact a dielectric layer.

A cavity of the subject disclosure may have any suitable configuration so long as it allows for both holes and electrons to be injected into an electroluminescent layer contained within the cavity. For example, in certain embodiments, the cavity is axially symmetrical. In certain embodiments, the cavity includes a constant cross-sectional area along the cavity axis. In certain embodiments, the cavity has a smaller cross-sectional area at the dielectric layer than the hole-injection electrode layer.

Methods of Fabricating an Electroluminescent Device

In one aspect, the subject disclosure provides a method for forming the above described electroluminescent devices. In certain embodiments, the method involves first providing a substrate upon which a layered structure is formed, wherein the layered structure includes an anode and/or a hole-injection layer, an electroluminescent material layer, and an electron-injection (e.g., polyethylene glycol dimethyl ether and barium acetylacetonate layer) and a cathode layer. Additionally, a layered structure of the device may include both a dielectric layer, interposed between an anode and/or hole-injection layer(s) and an electron-injection and cathode layer (s), and a cavity.

For instance, once deposited, one or more layers of the layered structure may be modified to include a cavity, which cavity may extend through one or more electrode layers and/or a dielectric layer (if included). Accordingly, a device with a layered structure of the disclosure may include a cavity that extends through an anode and/or hole-injection electrode layer and/or a dielectric layer and/or an electron-injection and/or cathode layer, in such a manner that an interior of the cavity surface is exposed, wherein the interior cavity surface may include one or more of the following surfaces: an anode region and/or a hole-injection electrode region, and/or a dielectric region and/or an electron-injection electrode region and/or a cathode region. The method may further include producing a hole-injection layer and/or an electron injection layer and/or a hole-transport and/or electron-transport layer on one or more interior surfaces of the cavity and/or may include coating an interior cavity surface with an electroluminescent coating material so as to provide the electroluminescent material electrical contact with the anode/hole-injection and electron-injection electrode/cathode regions.

In the methods of fabricating an electroluminescent device of the subject disclosure, a variety of techniques may be used to deposit each layer on to the substrate and/or a previously deposited layer thereof. Such deposition techniques include, but are not limited to, high vacuum evaporation, sputtering, chemical vapor deposition, electroplating, spin coating, ink-jet printing, screen printing and other techniques familiar to one of ordinary skill in the art of semiconductor fabrication.

It is to be noted, however, that the deposition technique should be chosen according to the material used to form the layer. For instance, in certain embodiments, metals, such as those used to produce a typical anode or cathode layer, may be deposited by evaporation, sputtering, electroplating, chemical vapor deposition, etc., and in certain embodiments, a polymer solution, such as that used to produce an electron-injection layer of the disclosure, may be deposited on to the substrate and or upon one or more preceding layers by a solution processing method.

For example, a unique feature with respect to the formulation of the layered devices of the present disclosure is that the electron-injection layer (e.g., a polyethylene glycol dimethyl ether and barium acetylacetonate layer), may be deposited on to the substrate and or upon one or more preceding layers by a solution processing method.

For instance, where the electron-injection layer includes a composition that contains a polymer, e.g., a polymer with a polar functional group, and a metal diketonate, such as a composition that includes polyethylene glycol dimethyl ether and barium or calcium acetylacetonate, the composition may be deposited onto the substrate or one or more preceding layers on the substrate, by a solution processing method such as spin-coating, ink-jet printing or the like. Accordingly, in certain instances, the polymer containing composition for forming an electron-injection layer of the disclosure is not deposited on to the substrate, or one or more preceding layers on the substrate, using a method that would result in the degradation of the polymer composition. In certain embodiments, the electron-injection layer is not deposited onto the substrate or one or more preceding layers thereof by a method involving vacuum evaporation, chemical vapor deposition or the like.

In certain embodiments, so as to achieve a well-controlled thickness for each layer, vacuum deposition technology may be employed in the deposition of the anode and/or hole-injection layer and/or dielectric layer (if included) and/or cathode layer, while spin-coating or ink-jet printing may be employed in the deposition of the electron-injection layer and/or the hole-injection layer. In certain embodiments, for instance, where the anode and/or cathode layers form separate and distinct layers from the hole-injection and/or electron injection layers, the anode and cathode layers may be deposited using a vacuum deposition process and the hole injection and/or electron injection layers may be deposited using a solution processing method. Such vacuum deposition processes may include, but are not limited to, arc physical vapor deposition, electron-beam evaporation, enhanced arc physical vapor deposition, chemical vapor deposition, magnetronic sputtering, molecular beam epitaxy, combinations of such techniques and a variety of other techniques known to one of ordinary skill in the art. One of ordinary skill in the art will also recognize that chemical vapor deposition is also suited for forming dielectric layer materials, such as silicon nitride.

Chemical vapor deposition may involve heating a substrate surface to a sufficiently high temperature to decompose gaseous organic species to form the desired film. Such heating may preclude the use of certain substrates which are adversely affected by the heat, such as certain plastics. Physical vapor deposition, on the other hand, does not necessarily exclude plastics as a substrate. In addition, some substrate heating may be employed in physical vapor deposition to promote film adhesion. It is also to be noted that vacuum deposition may be required if a reactive metal such as magnesium or calcium is used as an electrode layer material.

Figure 11:
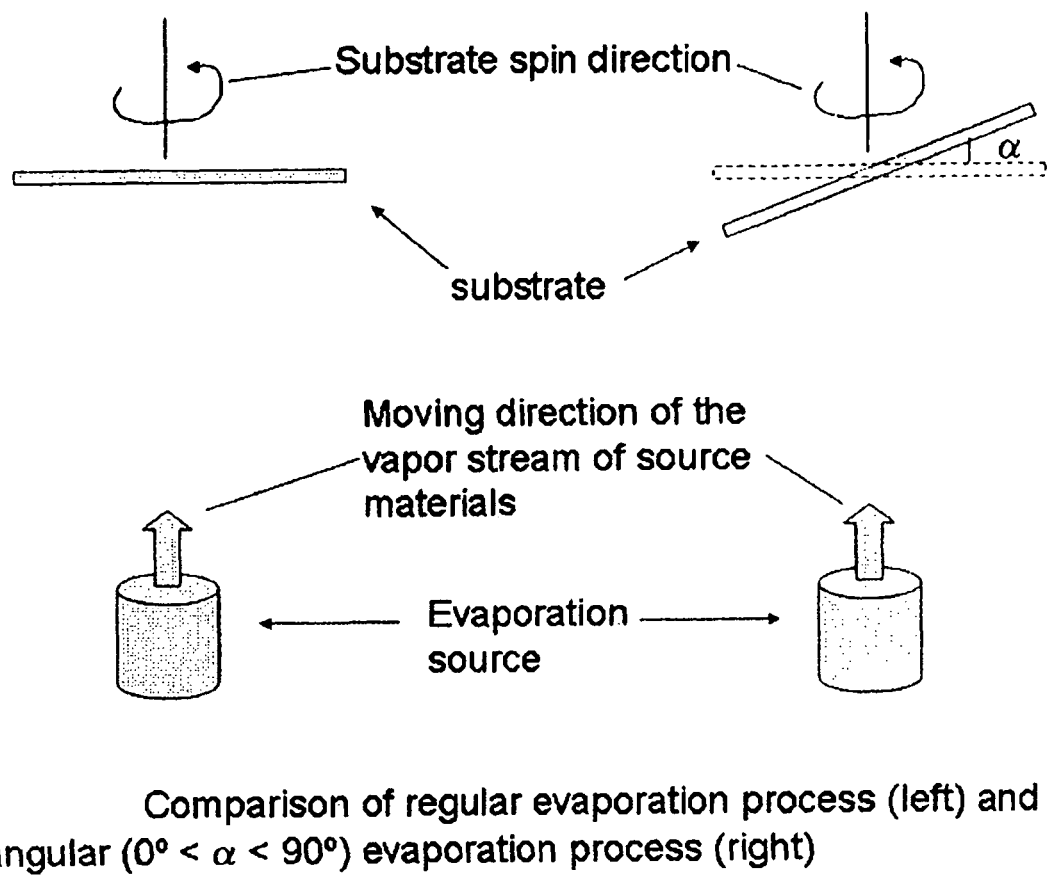
FIG. 11 schematically depicts an exemplary method for forming a cavity in a OLED electroluminescent device in accordance with the subject disclosure.

In certain embodiments, the electroluminescent (e.g., organic) layer can be produced by employing such processes as those that have been developed for traditional organic light emitting diode (OLED) and cavity containing organic light emitting diode (COLED) formation. In certain embodiments, the electroluminescent layer may be deposited using the same method as is employed in depositing the hole-injection and/or electron-injection layers. That is, in certain embodiments, for instance, when producing a polymeric containing OLED or COLED, a hole-injection (e.g., PEDOT), electron-injection and/or a light emitting polymer (LEP) layer(s) can be spin-coated (see FIG. 11), which may be preceded or followed by vacuum deposition of a regular electrode layer, such as an anode and/or cathode layer, such as an Al cathode layer.

Figure 2:
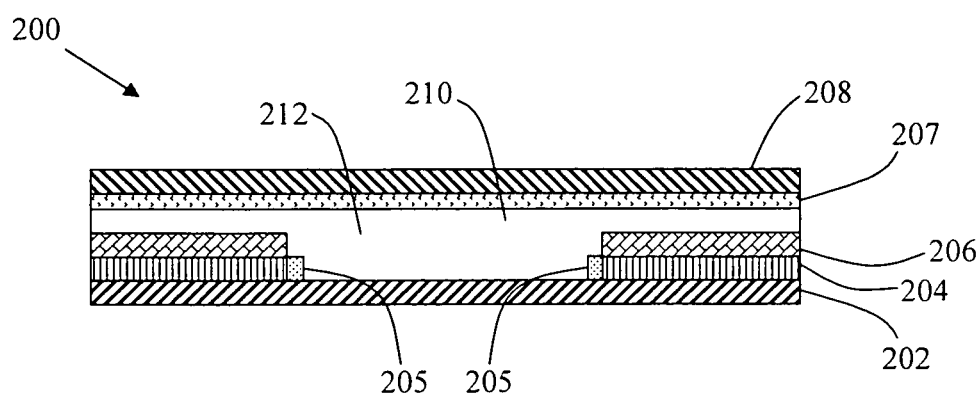
FIG. 2 depicts an electroluminescent device of the present disclosure in which a cathode and electron-injection layer are deposited above an electroluminescent material, the electroluminescent material forms a layer that is interposed between an electron-injection electrode layer and a dielectric layer, additionally, a cavity extends through both the dielectric layer and an anode layer, but does not extend through the electron-injection electrode layer.
Figure 4:
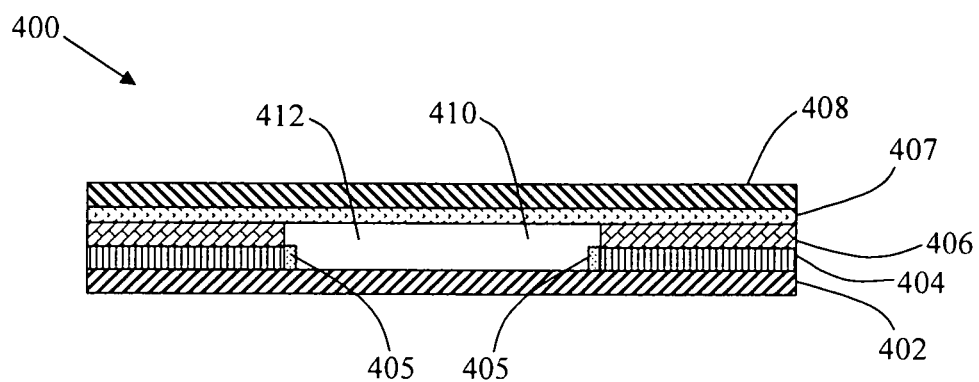
FIG. 4 depicts an electroluminescent device of the present disclosure in which a cathode and electron-injection layer are deposited above an electroluminescent material, the electroluminescent material fills a cavity but is not interposed between the electron-injection electrode layer and a dielectric layer, and the cavity extends through both the dielectric layer and an anode layer, but does not extend through the electron-injection electrode layer.
Figure 6:
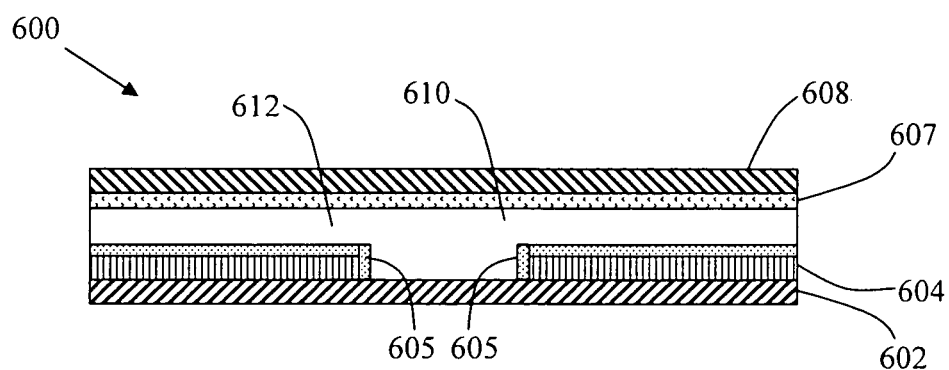
FIG. 6 depicts an electroluminescent device of the present disclosure in which a cathode and electron-injection electrode layer are deposited above an electroluminescent material, the electroluminescent material fills a cavity and is interposed between the electron-injection electrode layer and a hole-injection and anode layer, additionally, the cavity extends through the dielectric layer and the hole-injection and anode layer, but there is no dielectric layer, rather the electroluminescent material serves the purpose of separating the hole-injection electrode layer and the electron-injection electrode layer.

Similarly, a small molecule COLED can be produced via the established vacuum deposition processes with the use of a solution processing method for the deposition of the electron-injection layer, although in certain circumstances (e.g., when the substrate uses one of the structures shown in FIGS. 2, 4, and 6 an angular deposition (e.g., see FIG. 11) maybe used. In the case of small molecule COLED, the deposition sequence can be either the same as a regular OLED or can be reversed. That is, either in the sequence of "Anode Metal/Hole-Injection/Hole-Transport/Electroluminescent Layer/Electron-Transport/Electron-Injection/Cathode Metal" (wherein a metal layer on the substrate functions as the anode) or "Cathode Metal/Electron-Injection/Electron-transport/Electroluminescent Layer/Hole-Transport/Hole-Injection/Anode metal" (wherein a metal layer on substrate function as the cathode).

Accordingly, in on aspect, the subject disclosure is directed to methods of depositing a polymer composition on a substrate. In certain embodiments, the method includes contacting a substrate with a polymer composition in a manner sufficient to deposit the polymer composition on to the substrate. In certain embodiments, the polymer composition includes a polymer, e.g., a polymer that contains one or more polar components (such as a polar functional group), and a compound containing a low work function metal element, such as a metal diketonate. In certain embodiments, a suitable polymer containing at least one polar component may be any polymer that contains a polar group and is capable of receiving and distributing a compound containing a low work function metal element, such as metal diketonate, throughout the polymer composition. In certain embodiments, a suitable polymer containing at least one polar component may be polyethylene glycol dimethyl ether, or other polyether, such as polymethylene glycol, polymethylene oxide, polyethylene glycol, polyethylene oxide, polypropylene glycol, polypropylene oxide, polybutylene glycol, polybutylene oxide, or one or more derivatives thereof, and the like.

In certain embodiments, a suitable compound containing a low work function metal element is a metal diketonate, which metal diketonate may be any metal diketonate capable of being associated with a composition containing a suitable polymer, e.g., a polymer containing polar group, and being distributed (e.g., uniformly) therein. In certain embodiments, a suitable metal diketonate may be a metal acetylacetonate, such as lithium acetylacetonate, barium acetylacetonate, beryllium acetylacetonate, calcium, acetylacetonate, magnesium acetylacetonate, sodium acetylacetonate, potassium acetylacetonate, cesium acetylacetonate, strontium acetylacetonate, boron acetylacetonate, aluminum acetylacetonate, gallium acetylacetonate, indium acetylacetonate, silver acetylacetonate, and alloys thereof.

For instance, in certain embodiments, a suitable electron-injection layer includes a polyethylene glycol dimethyl ether and barium or calcium acetylacetonate. For example, a suitable electron-injection layer composition to be onto a layered structure of the disclosure may include a blend of films. In certain embodiments, the blend includes from about 20% to about 90%, such as about 40% to about 80%, including about 50% to about 60% metal diketonate, such as about 60 to about 80% metal diketonate, such as barium or calcium acetylacetonate. Further, in certain embodiments, the blend includes about 10% to about 60%, such as about 20% to about 50%, including about 30% to about 40% of a polar polymer composition, such as about 20% to about 40% of a polar polymer, such as polyethylene glycol dimethyl ether. When mixed the blend may serve as an efficient electron injection layer with improved performance when integrated into an electroluminescent device, such as a PLED.

Accordingly, in certain embodiments, the blend includes two components. A component that includes a metal diketonate mixed with a suitable solvent and a component that includes a polar polymer, which components are blended together and then contacted with a layered structure of the disclosure. For instance, a first solution may include a metal diketonate, such as barium acetylacetonate hydrate (solid), which is mixed with a suitable solvent, such as 2-ethoxyethanol, in a ratio of approximately 10 mg solid per 1 mL solvent in a glass vial to form a saturated mixture, which mixture may then be sonicated in a water bath, e.g., for about 1 or more minutes. A second solution may include a polymer compound, for instance, a polyethylene glycol dimethyl ether, which is mixed with a suitable solvent, such as 2-ethoxyethanol, in a ratio of approximately 35 mg solid per 5 mL solvent.

To form a final solution, for instance, a solution of polyethylene glycol dimethyl ether and barium acetylacetonate, for deposition onto a suitable layered structure of the disclosure, so as to form an air stable, low work function electron-injection layer thereon, 9 parts (by volume) of the first metal diketonate containing solution may be mixed with 1 part (by volume) of the second solution, e.g., a solution containing polyethylene glycol dimethyl ether. This mixture may then be filtered through a 0.20 m syringe filter. The filtered solution may then be spin-coated (e.g., at about 3000-4000 rpm for 1 minute) on top of a layered structure of the disclosure, such as a light-emitting polymer film layer, so as to produce a uniform electron injection layer thereon. The substrate may then subsequently be baked at about ~80° C. under vacuum for approximately 30 minutes. Al may then be evaporated to form conductive electrode/contacts.

Accordingly, the two solutions, e.g., polyethylene glycol dimethyl ether and barium acetylacetonate, may be combined prior to contacting the substrate. Alternatively, they may be combined sequentially upon the substrate. In certain embodiments, the two solutions are combined by mixing, blending, or the like. In certain embodiments, the mixing results in a final product that includes from about 20% to about 40% polyethylene glycol dimethyl ether and about 60% to about 80% barium acetylacetonate.

As can be seen with respect to the above, a device of the disclosure may have a plurality of different configurations depending upon how the device is fabricated. For instance, as can be seen with reference to FIG. 1, an electroluminescent device fabricated in accordance with the methods of the disclosure is provided. The device (100) includes a substrate (102), an anode layer (104), a hole-injection layer (105), an electroluminescent (e.g., light emitting polymer) material (106), an electron-injection layer, e.g., a polyethylene glycol dimethyl ether and barium acetylacetonate layer, (107), and a cathode layer (108). Accordingly, the device of FIG. 1 may be produced by providing a substrate and depositing on a surface thereof, in accordance with the methods described above, an anode layer, a hole-injection layer, an electroluminescent layer, an electron-injection layer, and a cathode layer.

It is to be noted, that although the device of FIG. 1, and the method of making the device, has been represented with respect to the anode layer being deposited on the substrate first, followed sequentially by the deposition of the following layers, it is understood that this order may be reversed such that the cathode layer may be deposited upon the substrate first, followed by deposition of the electron injection layer, et seq. Further, it is also to be noted that although the anode and hole-injection layers are represented as being two separate layers, in certain embodiments, the anode layer and hole-injection layer comprise a single layer. Further still, it is to be noted that in certain embodiments, a hole-transport layer may also be included in the device and therefore may be deposited between the hole-injection and electroluminescent layer, and/or an electron-transport layer may be included in the device and therefore may be deposited between the electroluminescent layer and the electron-injection layer.

As can be seen with respect to FIG. 2, an electroluminescent device containing a cavity in accordance with the subject disclosure is set forth. The device (200) includes a substrate (202), an anode layer (204), a dielectric layer (206), an electron-injection layer (207), and a cathode layer (208). The device also includes a cavity (210) that includes an electroluminescent material (212), which cavity may also include a hole-injection layer (205).

Accordingly, the device of FIG. 2 may be produced by providing a substrate and depositing on a surface thereof, in accordance with the methods described above, an anode layer and a dielectric layer. Further, once these layers are deposited on the substrate, a cavity may be formed, in accordance with the methods described herein, and optionally, one or more surfaces of the cavity comprising the anode layer may be contacted and/or coated with a hole injection layer. Additionally, once the cavity is formed, an electroluminescent material, such as a light emitting polymer, layer may be deposited therein. Further, once the electroluminescent layer has been deposited an electron-injection layer and a cathode layer may then be deposited.

As can be seen with reference to FIG. 2, the electroluminescent material (212), forms a material layer that separates the electron-injection layer (207) from the dielectric layer (206). Thus, in certain embodiments, the electroluminescent material (212) not only entirely fills the cavity but overflows and forms a separate material layer that is interposed between the electron-injection layer (207) and the dielectric layer (206). Additionally, as can be seen with respect to FIG. 2, the cavity (210) extends through both the dielectric layer (206) and anode layer (204) and is therefore bounded by the dielectric layer (206), the hole-injection layer (205) and a top surface of the substrate. The electron-injection layer (207) and cathode layer (208) span across the cavity (212).

It is to be noted with respect to FIG. 2, and the other embodiments set forth herein and described below, although the device, and the method of making the device, has been represented with respect to the anode layer being deposited on the substrate first followed by the deposition of the dielectric layer and a hole injection layer, it is understood that the cathode layer may be deposited on the substrate first followed by the deposition of the dielectric layer and electron-injection layer.

Further, it is also to be noted, with respect to FIG. 2, and the other embodiments set forth herein and described below, that although the anode and hole-injection layers are represented as being two separate layers, in certain embodiments, the anode layer and hole-injection layer comprise a single layer.

Further still, it is to be noted, with respect to FIG. 2, and the other embodiments set forth herein and described below, that in certain embodiments, a hole-transport layer may be included in the device and therefore may be deposited adjacent to the hole-injection layer, and/or an electron-transport layer may be included in the device and therefore may be deposited adjacent to the electron-injection layer. In certain embodiments, the hole-injection layer may be omitted.

Figure 3:
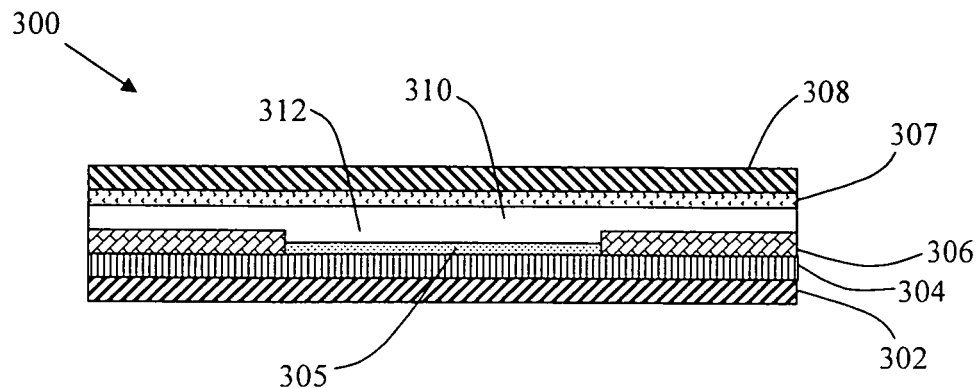
FIG. 3 depicts an electroluminescent device of the present disclosure in which a cathode and electron-injection layer are deposited above a electroluminescent material, the electroluminescent material forms a layer that is interposed between the electron-injection electrode layer and the dielectric layer, and a cavity extends through the dielectric layer but does not extend through a hole-injection, anode layer or the electron-injection electrode layer.

As can be seen with respect to FIG. 3, an electroluminescent device in accordance with the subject disclosure is set forth. The device (300) includes a substrate (302), an anode layer (304), a dielectric layer (306), an electron-injection layer (307), and a cathode layer (308). The device also includes a cavity (310) that includes a hole-injection layer (305), which layer is optional, and an electroluminescent material (312).

Accordingly, the device of FIG. 3 may be produced by providing a substrate and depositing on a surface thereof, in accordance with the methods described above, an anode layer and a dielectric layer. Further, once these layers are deposited on the substrate, a cavity may be formed, in accordance with the methods described herein below, and optionally, one or more surfaces of the cavity comprising the anode layer may be contacted and/or coated with a hole-injection layer. Additionally, once the cavity is formed, an electroluminescent material, such as a light emitting polymer, layer may be deposited therein. Further, once the electroluminescent layer has been deposited an electron-injection layer and a cathode layer may then be deposited.

As can be seen with reference to FIG. 3, the electroluminescent material (312), forms a material layer that separates the electron-injection layer (307) and cathode layer (308) from the dielectric layer (306). Specifically, in certain embodiments, the electroluminescent material (312) not only entirely fills the cavity but overflows and forms a separate material layer that is interposed between the electron-injection layer (307)/cathode layer (308) and the dielectric layer (306).

Additionally, as can be seen with respect to FIG. 3, although the cavity (310) extends through the dielectric layer (306), the cavity (310) does not extend through the hole-injection layer (305) or the anode layer (304). Accordingly, the cavity is bounded by the dielectric layer (306) and the hole-injection layer (304). The electron-injection layer (307) and the cathode layer (308) spans across the cavity (312). It is to be noted, that although the electron-injection layer is depicted as spanning the entire length of the cathode layer, in this embodiment and the other such embodiments described herein, the electron-injection layer may span a partial portion of the cathode layer, for instance, it may span a cathode portion that would otherwise contact the electroluminescent material.

It is to be noted that although FIG. 3 has been described with respect to the anode layer being the bottom layer positioned above the substrate and the cathode layer being positioned as the top most layer away from the substrate, the position of the electrode layers and respective injection layers may be reversed, e.g., the cathode layer may be the bottom layer positioned above the substrate and the anode layer may be positioned as the top most layer away from the substrate.

As can be seen with respect to FIG. 4, an electroluminescent device in accordance with the subject disclosure is set forth. The device (400) includes a substrate (402), an anode (404), a dielectric layer (406), an electron-injection layer (407), and a cathode layer (408). The device also includes a cavity (410) that includes a hole-injection layer (405), which layer is optional, and an electroluminescent coating material (412).

Accordingly, the device of FIG. 4 may be produced by providing a substrate and depositing on a surface thereof, in accordance with the methods described above, an anode layer and a dielectric layer. Further, once these layers are deposited on the substrate, a cavity may be formed, in accordance with the methods described herein below, and optionally, one or more surfaces of the cavity comprising the anode layer may be contacted and/or coated with a hole-injection layer. Additionally, once the cavity is formed, an electroluminescent material, such as a light emitting polymer, layer may be deposited therein. Further, once the electroluminescent layer has been deposited an electron-injection layer and a cathode layer may then be deposited.

It is to be noted that although FIG. 4 has been described with respect to the anode layer being the bottom layer positioned above the substrate and the cathode layer being positioned as the top most layer away from the substrate, the position of the electrode layers and respective injection layers may be reversed, e.g., the cathode layer may be the bottom layer positioned above the substrate and the anode layer may be positioned as the top most layer away from the substrate.

As can be seen with reference to FIG. 4, the electroluminescent material (412) is contained entirely within the cavity (410). Specifically, in certain embodiments, the cavity (410) extends through both the dielectric layer (406) and anode layer (404) and is therefore bounded by the dielectric layer (406), the hole-injection layer (405), a top surface of the substrate (402), and the electron-injection layer (407) and the cathode layer (408), which layers span across and bound the cavity (412).

It is to be noted that although FIG. 4 has been described with respect to the anode layer being the bottom layer positioned above the substrate and the cathode layer being positioned as the top most layer away from the substrate, the position of the electrode and injection layers may be reversed, e.g., the cathode layer may be the bottom layer positioned above the substrate and the anode layer may be positioned as the top most layer away from the substrate.

Figure 5:
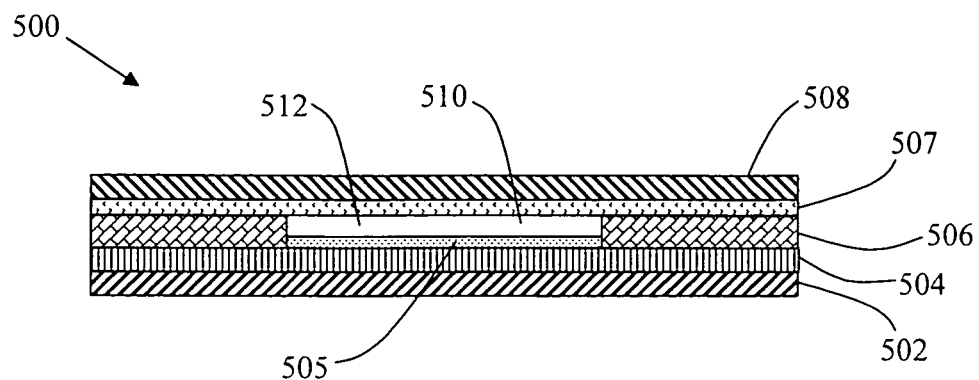
FIG. 5 depicts an electroluminescent device of the present disclosure in which a cathode and electron-injection layer are deposited above the electroluminescent material, the electroluminescent material fills the cavity but is not interposed between the electron-injection electrode layer and the dielectric layer, and the cavity extends through the dielectric layer but does not extend through the hole-injection electrode layer or the electron-injection electrode layer.

As can be seen with respect to FIG. 5, an electroluminescent device in accordance with the subject disclosure is set forth. The device (500) includes a substrate (502), an anode (504), a dielectric layer (506), an electron-injection layer (507), and a cathode layer (508). The device also includes a cavity (510) that includes a hole-injection layer (505), which layer is optional, and an electroluminescent coating material (512).

Accordingly, the device of FIG. 5 may be produced by providing a substrate and depositing on a surface thereof, in accordance with the methods described above, an anode layer and a dielectric layer. Further, once these layers are deposited on the substrate, a cavity may be formed, in accordance with the methods described herein below, and optionally, one or more surfaces of the cavity comprising the anode layer may be contacted and/or coated with a hole injection layer. Additionally, once the cavity is formed, an electroluminescent material, such as a light emitting polymer, layer may be deposited therein. Further, once the electroluminescent layer has been deposited an electron-injection layer and a cathode layer may then be deposited.

As can be seen with reference to FIG. 5, the electroluminescent material (512) is contained entirely within the cavity (510). Specifically, in certain embodiments, the cavity (510) extends through the dielectric layer (406) but not the hole-injection layer (505) or the anode layer (504) and is therefore bounded by the dielectric layer (506), the hole-injection layer (504), the electron-injection layer (507) and cathode layer (508), which layers span across and bound the cavity (512).

It is to be noted that although FIG. 5 has been described with respect to the anode layer being the bottom layer positioned above the substrate and the cathode layer being positioned as the top most layer away from the substrate, the order of the electrode layers and their respective injection layers may be reversed, e.g., the cathode layer may be the bottom layer positioned above the substrate and the anode layer may be positioned as the top most layer away from the substrate.

As can be seen with respect to FIG. 6, an electroluminescent device in accordance with the subject disclosure is set forth. The device (600) includes a substrate (602), an anode layer (604), a hole-injection layer (605), an electron-injection layer (607), and a cathode layer (608). The device also includes a cavity (610) that includes an electroluminescent material (612).

As can be seen with reference to FIG. 6, the electroluminescent material (612), forms a material layer that separates the electron-injection layer (607) from the hole-injection electrode layer (605). Specifically, in certain embodiments, the electroluminescent coating material (612) not only entirely fills the cavity but overflows and forms a separate material layer that is interposed between the electron-injection layer (607) and the hole-injection layer (605).

Additionally, as can be seen with respect to FIG. 6, the cavity is bounded by the hole-injection layer (604 and 605) and a top surface of the substrate (602). The electron-injection/cathode layer (607 and 608) spans across the cavity (612).

Accordingly, the device of FIG. 6 may be produced by providing a substrate and depositing on a surface thereof, in accordance with the methods described above, an anode layer. Further, once the anode layer has been deposited on the substrate, a cavity may be formed, in accordance with the methods described herein below, and optionally, one or more surfaces of the anode layer may be contacted and/or coated with a hole injection layer. Additionally, once the cavity is formed, an electroluminescent material, such as a light emitting polymer, layer may be deposited therein. Further, once the electroluminescent layer has been deposited an electron-injection layer and a cathode layer may then be deposited.

It is to be noted that although FIG. 6 has been described with respect to the anode layer being the bottom layer positioned above the substrate and the cathode layer being positioned as the top most layer away from the substrate, the position of the electrode layers and their respective injection layers may be reversed, e.g., the cathode layer may be the bottom layer positioned above the substrate and the anode layer may be positioned as the top most layer away from the substrate.

Accordingly, in certain embodiments, an electroluminescent material layer separates the top most (e.g., with respect to the substrate) electrode layer from the dielectric layer. See, for instance, FIGS. 2 and 3. In certain embodiments, the top most electrode layer directly contacts the dielectric layer. See, for instance, FIGS. 4 and 5. In certain embodiments, there is no dielectric layer, rather the electroluminescent layer separates the hole-injection layer from the electron-injection layer. See, for instance, FIG. 6.

Further, in certain embodiments, the electrode (e.g., cathode) layer is positioned above and bounds the cavity but indirectly covers the cavity. By "indirectly covers the cavity," is meant that an intervening layer, e.g., an electron-injection layer, is present between the electrode (e.g., cathode) layer and one side of the cavity, such that although the electrode (e.g., cathode) layer is positioned above, bounds and spans across a length of the cavity (e.g., entirely), an separate intervening layer, e.g., an electron-injection layer, is present between the electrode (e.g., cathode) layer and the cavity. Further, in certain embodiments, the material filling the cavity, e.g., an electroluminescent material, overflows the dimensions of the cavity in such a manner that it forms an intermediary or intervening layer between the cavity and the electron-injection and/or cathode layers. See, for instance, FIGS. 2 and 3. Further, as set forth above, the position of the cathode and electron-injection electrode layer and the anode and hole-injection electrode layers may be reversed.

In certain embodiments, the electron-injection electrode layer bounds the cavity and may additionally directly or indirectly cover at least the entire length of the cavity. Hence, in certain embodiments, the electron-injection layer directly covers the cavity. By "directly covers the cavity," is meant that the electron-injection layer bounds and directly covers one side of the cavity without the presence of an intervening layer. Hence, although the cavity may be filled with a material, such as an electroluminescent material, neither the filling material nor another material over-flows beyond the dimensions of the cavity, or is present between the cavity and the electron-injection electrode layer, in such a manner that it would be considered an intervening layer between the cavity and the electron-injection layer, which layer bounds and directly covers the cavity on one side. See, for instance, FIGS. 4 and 5.

As described above, an electroluminescent device of the subject disclosure may include a cavity. A wide variety of methods may be used to form the cavity. A cavity may be formed, for example, with the aid of nanoimprinting. Alternatively, a cavity may be formed by means of a wet or dry etch process. Photoresist may be used in etching to define the location of the cavity. The etchant may be a gas, liquid, solid or a combination thereof or require an additional energy source such as electromagnetic radiation or electrons. Ion milling or reactive ion etch, for example, may be used.

The electroluminescent material may be applied to the interior cavity surface through any of a number of techniques that depend on the material properties of the electroluminescent material itself. When the electroluminescent material is polymeric in nature, the coating material may be formed in situ on the cavity surface or applied by solvent casting, spin coating, spray coating, printing or other techniques to the cavity surface.

As the cavity surface may easily oxidize or otherwise become contaminated before the electroluminescent coating material is applied, surface treatments may be employed immediately prior to the application of the electroluminescent material. For example surface treatments may include, but are not limited to: drying cleaning (e.g., exposure to plasma), wet etching, solvent cleaning. In addition, the cavity surface may be modified by attaching a surface-modifying moiety to provide for improved adhesion between the cavity surface and the electroluminescent coating. Cavity surface modification may also involve providing a material or coating that enhances hole and/or electron transport between the electrodes and the electroluminescent coating.

Collectively, FIG. 7 illustrates one method for forming an electroluminescent device as a layered structure on a substrate. It is to be noted that this method may be modified accordingly so as to provide any device in accordance with the disclosure and described herein. FIG. 7A illustrates a suitable substrate (70) of the subject disclosure upon which a layered structure of the disclosure is to be deposited. FIG. 7B illustrates the deposition of an anode and/or a hole-injection electrode layer (72) on a substrate (70). FIG. 7C illustrates the deposition of a dielectric layer (74) on the anode and/or hole-injection electrode layer (72). FIGS. 7D and 7E illustrate the formation of a cavity (80) through the dielectric and anode and/or hole-injection electrode layers (72 and 74, respectively) by using a lithographic and/or etching technique. FIG. 7D illustrates the beginning of the formation of a cavity (80), in the layered structure after the etchant is applied to the layered structure. FIG. 7E illustrates a fully formed cavity (80), wherein the cavity (80) extends from opening (82) entirely through the layered structure and terminates at the substrate (70). The cavity (80) is bounded by a surface of the substrate (71), a surface of the anode and/or hole-injection electrode region (73), and a surface of the dielectric region (75). While FIG. 7E illustrates that cavity (80) having a cylindrical shape can be formed, it is also possible to form cavities of other shapes (e.g., the side wall profile of the cavity may be tapered or rounded, so that the cavity is bounded not by walls at a 90° angle but rather at an angle that is less than 90°, for instance, an angle that is about 45° or less) by selective application of one or more isotropic or anisotropic etchants to the layered structure.

The etchant may be a gas, liquid, solid or a combination thereof or require an additional energy source such as electromagnetic radiation or electrons. That is, either dry (e.g., plasma or ion beam milling) or wet (e.g. chemical) etching techniques may be used. It should be evident that the etchant must be able to etch through at least one electrode material and the dielectric material in order to form the interior cavity surface having the hole-injection electrode region, the dielectric region and the electron-injection electrode region. Hence, the etching process may carried out using any suitable lithographic techniques generally known in the field of semiconductor processing such as stepper lithography, electron-beam lithography, laser interference lithography, nanoimprinting, and the like. One of ordinary skill in the art is capable of selecting and applying an etchant to form a cavity of desired geometry.

Figure 7A:
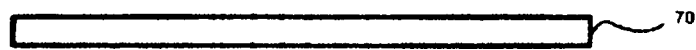
FIGS. 7A, 7B, 7C, 7D, 7E, 7F, and 7G collectively referred to as FIG. 7, illustrate a method for fabricating an electroluminescent device.
Figure 7B:
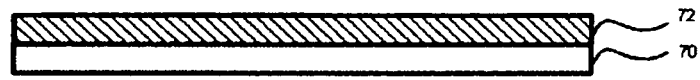
Figure 7C:
Figure 7D:
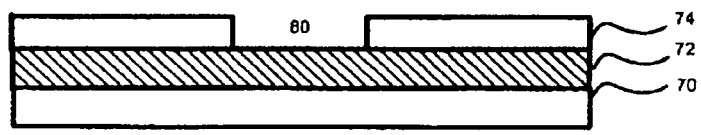
Figure 7E:
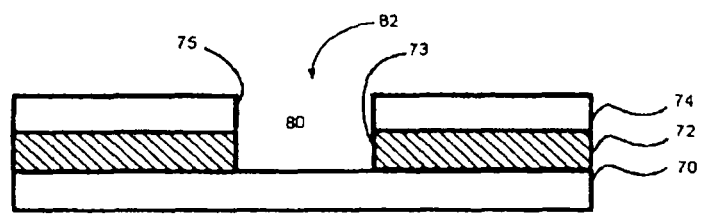
Figure 7F:
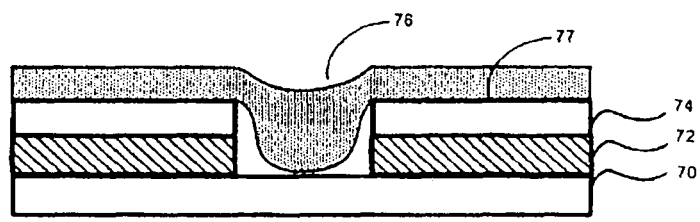

Once the cavity (80) has been formed, an electroluminescent material layer (76) may be applied to the interior cavity surfaces of the cavity (80) through any of a number of techniques that depend on the material properties of the electroluminescent material itself, so as to fill the cavity. For instance, when the coating material is polymeric in nature, the coating material may be formed in situ on the cavity surface or be applied by solvent casting, spin coating, spray coating, printing or other techniques to the cavity surface. FIG. 7F illustrates the application of an electroluminescent coating material (76) to the interior surface of the cavity (80) so as to achieve conformal contact between the coating material and the interior surface of the cavity.

The coating material (76) may be applied as a film over the exterior surface (77) of the dielectric layer (74) of the layered structure illustrated in FIG. 7F. As shown, a portion of the electroluminescent material (76) fills the cavity (80). However, such application of electroluminescent material may result in void space between the electroluminescent coating material and a surface of the cavity. The void may be eliminated by subjecting the coating material to heat and/or vacuum (or using a surface modifier), particularly when the coating material is a polymeric material.

The interior surface of the cavity may be modified before the electroluminescent material is applied. As the cavity surface may easily oxidize or otherwise become contaminated before the electroluminescent coating material is applied, surface treatments may be employed immediately prior to the application of the electroluminescent material. For example of surface treatments include, but are not limited to, drying and cleaning (e.g., exposure to plasma), wet etching, solvent cleaning. In addition, the cavity surface may be modified by attaching a surface-modifying moiety to provide for improved adhesion between the cavity surface and the electroluminescent coating. Cavity surface modification may also involve providing a material or coating that enhances hole and/or electron transport between the electrodes and the electroluminescent coating. For instance, a suitable hole or electron injection material, as described herein, may be used to coat one or more surfaces of the cavity.

Figure 7G:
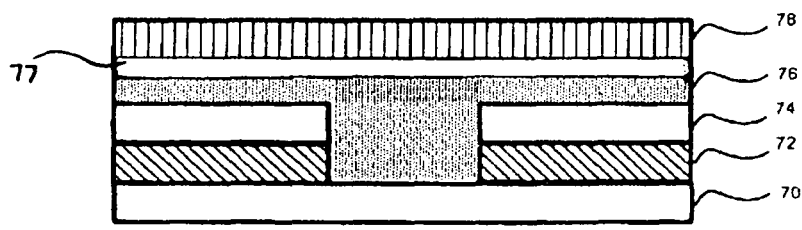
Figure 8A:
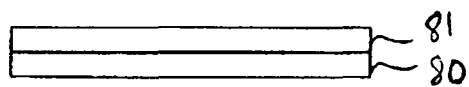
FIGS. 8A, 8B, 8C, 8D and 8E collectively referred to as FIG. 8, illustrate an alternative method for making a cavity-containing layered structure of a luminescent device.
Figure 8B:
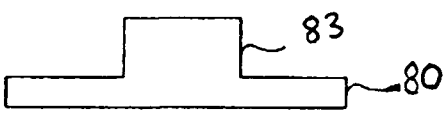
Figure 8C:
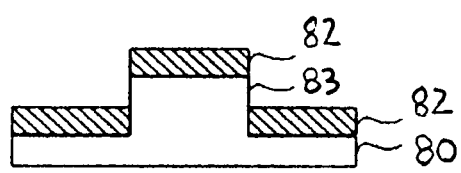
Figure 8D:
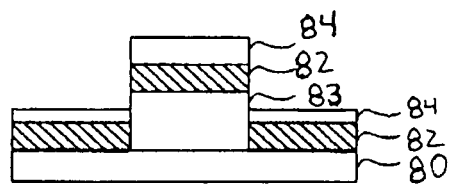
Figure 8E:
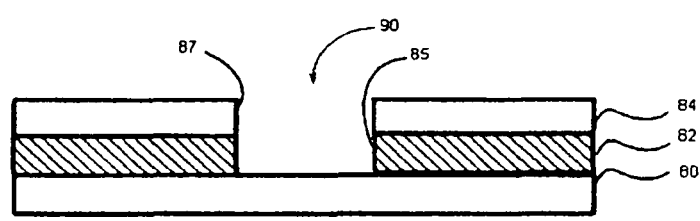

FIG. 7G illustrates the deposition of an electron-injection layer (77), e.g., via solution processing, on the electroluminescent material layer (76) and the deposition of a cathode layer (78) on top of the electron-injection layer (77), thereby forming a layered structure. It is to be noted, that in certain embodiments, electroluminescent material (76) fills the cavity (80) but does not form an intermediary layer between the dielectric layer (74) and the electron-injection layer (77). Hence, in certain embodiments the electron-injection layer (77) is deposited directly onto the dielectric layer (74) and covers the cavity (80) and the electroluminescent material layer (76), which at least partially fills the cavity (80).

Further, it is to be noted that the order of layer deposition can be reversed, i.e., the cathode and electron-injection electrode layer may be the initial layers deposited on the substrate. Hence, the cathode and electron-injection electrode layers can be deposited before or after the anode and/or hole-injection layer(s) and dielectric layer (if included) are deposited, the cavity has been formed and the electroluminescent layer has been deposited. Accordingly, either the cathode and/or the electron-injection layer or the anode and/or the hole-injection layer may form a layer the bounds, spans across and covers the cavity and/or any previously deposited layers (such as the electroluminescent layer, the dielectric layer, and the like). Furthermore, one or more additional layers may also be deposited, such as hole-transport layer or an electron-transport layer. In such an instance, the hole-transport layer should be deposited so as to be in contact with the hole-injection layer and/or in contact with the anode layer; and the electron-transport layer should be deposited so as to be in contact with the electron-injection layer.

FIG. 8 illustrates another method in which the electroluminescent device may be formed. FIGS. 8A and 8B illustrate the formation of a sacrificial member in the shape of a desired cavity of the layered structure of a luminescent device. In FIG. 8A, a photoresist (81) is deposited onto a substrate (80). The resist is then developed in a pattern, as illustrated in FIG. 8B, to provide a sacrificial member (83) in the shape of a desired cavity. FIG. 8C illustrates the deposition of an anode and/or hole-injection layer (82) on the substrate (80) and around the sacrificial member (83). Similarly, FIG. 8D illustrates the deposition of a dielectric layer (84) on the anode and/or hole-injection layer (82) and around the sacrificial member (83) When the sacrificial member is removed, a layered structure is formed having a cavity (90) through the anode and/or hole-injection and the dielectric layer (82). As shown in FIG. 8E, the interior surface of the cavity (90) of the layered structure is composed of an anode and/or hole-injection electrode region (85) and a dielectric layer region (87). The interior surface of the cavity of the layered structure is then coated with an electroluminescent coating material and an electron-injection electrode layer and cathode layer is deposited on the layered structure as described above.

Accordingly, as described above, in certain embodiments, an electroluminescent device of the subject disclosure comprises a cavity containing organic light-emitting diode (COLED), which as described above, includes multiple layers of organic thin films that are sandwiched between two electrode layers, such as an anode and a cathode layer. Based on the molecular weight of the organic materials used, a COLED of the disclosure may be a polymeric cavity containing OLED (or poly-COLED), e.g., if the organic active layers are made up of polymer materials, or a small molecular cavity containing OLED (or SM-COLED) if the organic layers are made up of small molecules.

Figure 9:
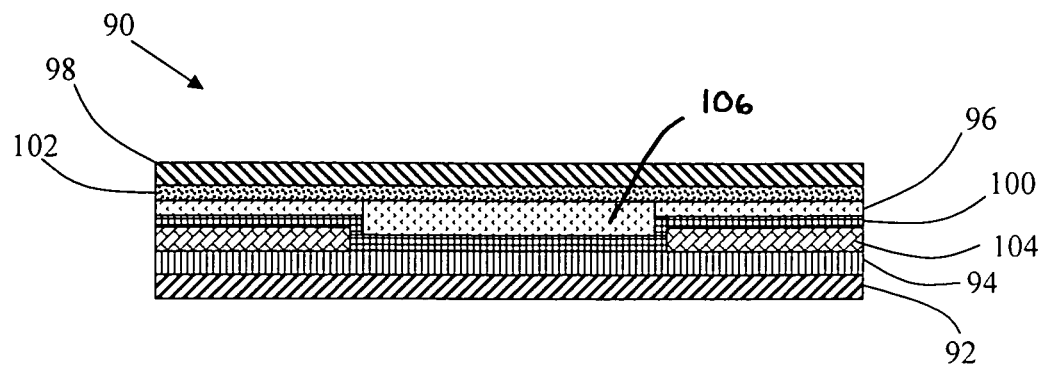
FIG. 9 schematically depicts an exemplary cavity containing polymeric OLED electroluminescent device in accordance with the subject disclosure.

Accordingly, in certain embodiments, a poly-COLED of the subject disclosure may include one or more organic layers. For instance, as set forth in FIG. 9, a poly-COLED (90) containing two organic layers is provided. The two organic layers include: a hole-injection (HI) layer (100) and an emissive layer (96). The HI layer (100) may include a conductive polymer, such as poly(3,4-ethylenedioxythiophene)poly(styrenesulfonate) or (PEDOT:PSS, sometimes simplified as PEDOT), which may be deposited partially on a dielectric layer (104) and may be partially deposited on an anode (94) layer (for instance, an anode layer that partially bounds a cavity), which anode layer (e.g., indium-tin oxide layer) is positioned above a substrate (92). The emissive layer (96) may be a light-emitting polymer (LEP) layer deposited on top of the HI layer (100). As shown in FIG. 9, the LEP layer (96) is contained within a cavity (106), wherein the cavity (106) is bounded on its sides by a dielectric layer (104) and on its bottom by the hole-injection layer (100), which forms a layer on top of the anode layer (94). An electron-injection layer, such as polyethylene glycol dimethyl ether and barium or calcium acetylacetonate, may then be deposited on top of the LEP layer (96) and a cathode (98) layer may be deposited on top of the electron-injection layer (102), e.g., by thermal evaporation. Accordingly, a suitable cathode layer may also include an electron-injection (EI) layer (102) (which may be ultra thin, e.g., ranging from several to hundreds of Å, layer of air-stable, low work function materials, such as polyethylene glycol dimethyl ether and barium or calcium acetylacetonate) and may be capped by a thin film (for instance, ranging from several hundreds to 2000 Å) of a stable metal such as Al or Ag to provide the necessary electrical conductivity (not shown).

Figure 10:
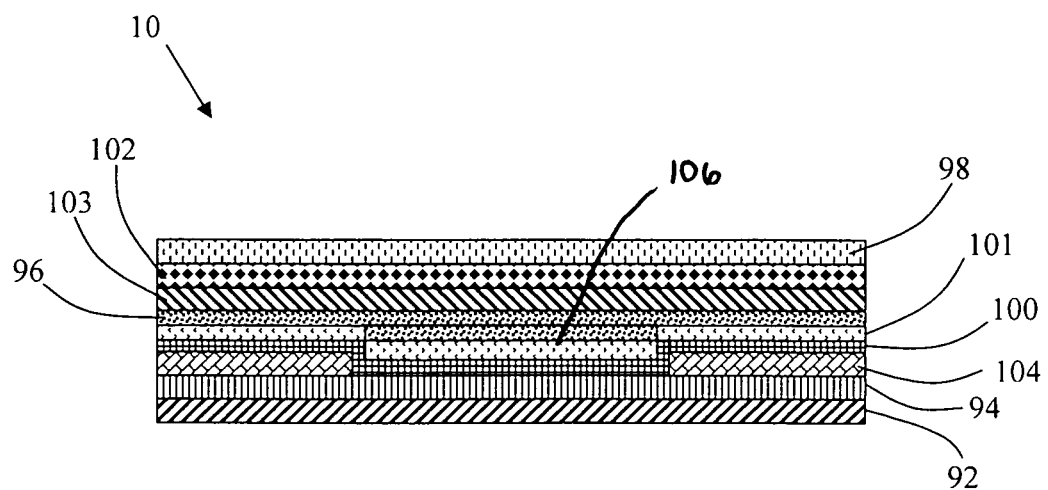
FIG. 10 schematically depicts an exemplary cavity containing small molecule OLED electroluminescent device in accordance with the subject disclosure.

In certain embodiments, as set forth in FIG. 10, an electroluminescent device of the subject disclosure comprises a SM-COLED (100), which may include more than two organic layers: a hole-injection (HI) layer (100), a hole transportation (HT) layer (101), one or more emissive (Em) layer(s) (96), an electron transportation (ET) layer (103), a electron-injection (EI) layer (102) and a cathode layer (98). Hence, these organic layers may be sandwiched between two electrodes, such as an anode (94) positioned above a substrate (93) and a cathode (98).

As shown in FIG. 10, the emissive (Em) layer (96) is contained within a cavity (106), wherein the cavity (106) is bounded on its sides by a dielectric layer (104) and on its bottom by the hole-injection layer (100), which forms a layer on top of the anode layer (94). A hole-transport layer (101) is positioned on the top of the hole-injection layer (100). The emissive layer (96) is positioned on top of the hole-transport layer (101) and an electron-transport layer (103) is positioned on top of the EM layer (96). An electron-injection layer (102) may then be positioned on top of the electron-transport layer (103). The cathode (98) layer (e.g. metal conductor layer) may then be positioned above the electron-injection layer (103).

In some cases, an additional hole blocking and/or electron blocking layer is also used to optimize device performance (not shown). Unlike polymer materials that can be processed from solution, small molecules may be deposited via vacuum evaporation. In certain embodiments, the configuration of the cathode is very similar to that used in poly-COLED, although the actual materials selected for the cathode may be determined by the property of the organic material that is in direct physical contact with the cathode.

APPLICATIONS

In another aspect, the subject disclosure is directed to the use of the above described electroluminescent device in the production of an electroluminescent lighting or display device, wherein the electroluminescent device includes a layered structure, as described above, which layered structure may include one or more cavities each extending through a portion of the layered structure such that each cavity has an interior cavity surface. The layered structure is adjacent to a suitable substrate (e.g., a transparent substrate) and includes an electroluminescent material that is in electrical contact with an anode and/or hole-injection electrode layer(s) as well as an electron-injection and/or cathode layer(s).

Preferably, where a plurality of cavities are provided, the plurality of cavities is arranged in an array. The cavities may be of different sizes and/or distributed regularly or irregularly. A possible reason for having irregularly sized or distributed cavities is that cavity size and distribution may influence the emission spectrum of radiation emitted by the electroluminescent material in the cavity.

A red, green and/or blue pattern for color display applications may also be provided. For instance, the cavities may contain an electroluminescent material that emits an electromagnetic radiation of a particular wavelength (e.g., a wavelength corresponding to a particular color). Specifically, the layered structure may be fabricated in such a manner that the electroluminescent material of the cavities emit colors when excited, wherein the colors emitted from the cavities correspond to subpixels of the display. For example, the cavities can be grouped into regions of three (e.g., a trimer), wherein each trimer forms a pixel, each pixel includes three subpixels, and each sub-pixel contains an electroluminescent material that emits electromagnetic radiation of a red, green, or blue wavelength.

Figure 12:
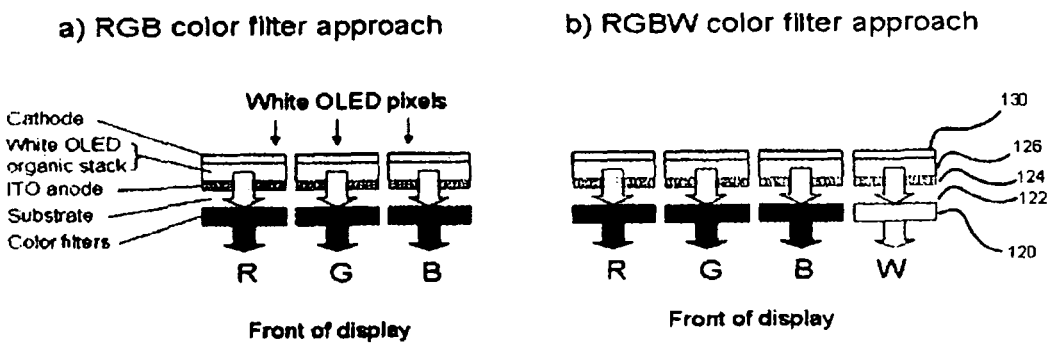
FIG. 12 schematically depicts an exemplary method for forming a color display in an cavity containing OLED electroluminescent device in accordance with the subject disclosure.

In certain embodiments, colored filters may be used to produce a colored display. In this embodiment, as set forth in FIGS. 12 A and B, a COLED is set forth, wherein the COLED includes a filter (120), which may be a red, green, blue, white, clear, or other color filter. The COLED also includes a substrate (122), an anode (124), an organic layer (126), and a cathode layer (130), additional layers (not shown) may also be included, such as a hole-injection and/or transport layer and/or an electron-injection (e.g., a polyethylene glycol dimethyl ether barium or calcium acetylacetonate layer) and/or transport layer.

Accordingly, as set forth in FIG. 12A, a COLED emitting white light may be used for all pixels. In other words, all the sub pixels may include the same COLED emitting white light. Red (R), green (G), and blue (B) color sub-pixels may be achieved by using color filters. In this approach, since each sub-pixel only makes use of one of the three components of the white light emitted by the pixel, the efficiency of the display may be reduced. This efficiency may be improved by using a 4-pixels approach, the RGBW approach set forth in FIG. 12B. In this approach, an additional white sub-pixel without using a color filter is introduced. Since this pixel makes use effectively of all the light emitted, the total efficiency of the display may be increased.

Hence, each pixel includes at least three sub-pixels, wherein each sub-pixel emits one of a red, green or blue light, so that each pixel includes all of a red, green, and blue sub-pixel. Typically, each sub-pixel may include tens, hundreds or thousands of sub-pixels. Accordingly, each cavity may be filled with an electroluminescent material capable of emitting one of these three colors or be filled with a material that emits white light but be associated with a colored filter. In this manner, the electroluminescent devices of the disclosure may be used to produce a color display device.

Further, one or more emission modifiers may be added to the electroluminescent material in each cavity. Suitable emission modifiers include, but are not limited to, organic and organometallic luminescent dyes such as 2-methyl-8-hydroquinoline aluminum, 8-hydroquinoline aluminum, coumarins, acridines, quinolone, carbostyryls, fluorols, phenoxazenes, rhodamines, and fluoresceins. In selecting a suitable light-emissive dye, one or ordinary skill in the art will recognize that color and luminescent efficiency are two important factors which can be determined through routine experimentation. Moreover, emission modifiers may themselves be polymeric electroluminescent materials. For example poly(1,4-phenylene vinylene), poly(2-methoxy-5-(2-ethylhexoxy)-1,4-phenylene vinylene) and poly(9,9-dioctyl-2,7-fluorene) may be adapted to emit green, orange-red and blue light, respectively. Other suitable modifiers include, but are not limited to, pigments and light absorbing dyes such as phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177. These modifiers can be added either by employing ordinary lithographic techniques or by using an inkjet technology to selectively deposit an emission modifier at desired cavities. If a photocurable photoresist technique is employed in order to modify an electroluminescent polymeric material, it may be desirable to crosslink the polymeric material in order to dimensionally stabilize the polymeric material and to prevent damage to it.

In an array or other arrangement of electroluminescent devices, of the subject disclosure, the activation of the electroluminescent material in each of the plurality of individual cavities (or groups of such cavities) may be under a suitable electronic control such that by turning the devices "on" and "off" to varying degrees it is possible to form a complete color image. This may be achieved, for example, by patterning the hole-injecting electrode layer and/or the electron-injecting electrode layer and/or by creating additional patterned layers which suitably connect portions of these layers to drive electronics. It is to be noted that an advantage of an electroluminescent device containing an air stable, low work function electron-injection layer, such as polyethylene glycol dimethyl ether and barium acetylacetonate, is that it provides the overall device with a significantly lower turn-on voltage, while at the same time producing a markedly higher efficiency and much lower leakage currents. Specifically, the electron-injection/cathode electrode layers for use in PLED or OLED devices of the subject disclosure are more efficient, use less power, have a longer lasting life, and have reduced leakage current when compared to similar devices in the art that do not employ an air stable, low work function electron-injection layer. This enhancement is especially pronounced in devices that include high LUMO levels and those devices that include blue-light emitting polymers, among others.

Accordingly, as can be seen with reference to the above, embodiments of the subject disclosure exhibit several advantages over other art in the field. For instance, in various cavity containing LED devices known in the field, the organic light emitting (e.g., emissive) layer is entirely contained within the cavity, this is not a requirement of various embodiments of the present disclosure. Additionally, multiple organic layers may be employed in various embodiments of the present disclosure, where as in various cavity containing LED devices known in the field this is not the case.

Further, with respect to various embodiments of the present disclosure, both "top" and "bottom" emitting configurations are available, where as in various cavity containing LED devices known in the field, only top emitting configurations are available. Furthermore, given the adaptability of various configurations of the devices of the present disclosure, the use of an air-stable cathode is not necessary. Rather, cathodes developed for conventional OLED can be used. This is contrary to in various cavity containing LED devices known in the field wherein an air-stable cathode is necessary and cathodes developed for conventional OLEDs can not be used.

Hence, a device of the present disclosure may be compatible with multi-layer small molecule OLEDs as well as polymeric OLEDs, and various cavity containing LED devices known in the field are not compatible with multi-layer small molecule OLEDs.

Additionally, various cavity containing LED devices known in the field are not compatible with fabrication processes developed for conventional OLED, whereas in certain embodiments of the present disclosure the devices to be manufactured are fully compatible with fabrication processes developed for conventional OLED and may include various solution processing methods, such as those used for producing an air-stable, low work function electron-injection/cathode layer of the subject disclosure.

Further, with respect to certain embodiments of a device of the present disclosure, the thickness of the dielectric layer can vary in a larger range without significantly affecting the device operating voltage and device fabrication yield, because of this a defect in the dielectric layer may not result in failure of device. However, with respect to various cavity containing LED devices known in the field, the thickness of the dielectric layer is limited within a small range (approximately 100±20 nm) to insure optimal device performance, plus the dielectric layer must defect-free as defects may result in device failure.

Figure 13A:
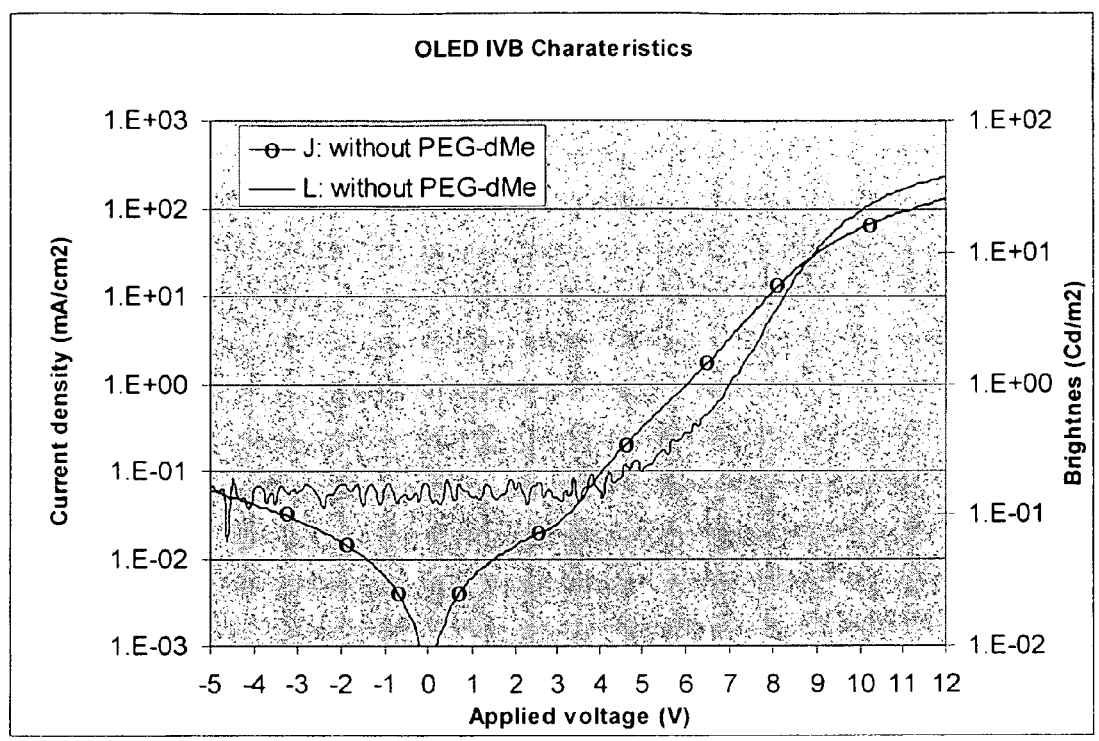
FIGS. 13A, 13B, and 13C are graphs demonstrating the effect of adding PEG-dMe.
Figure 13B:
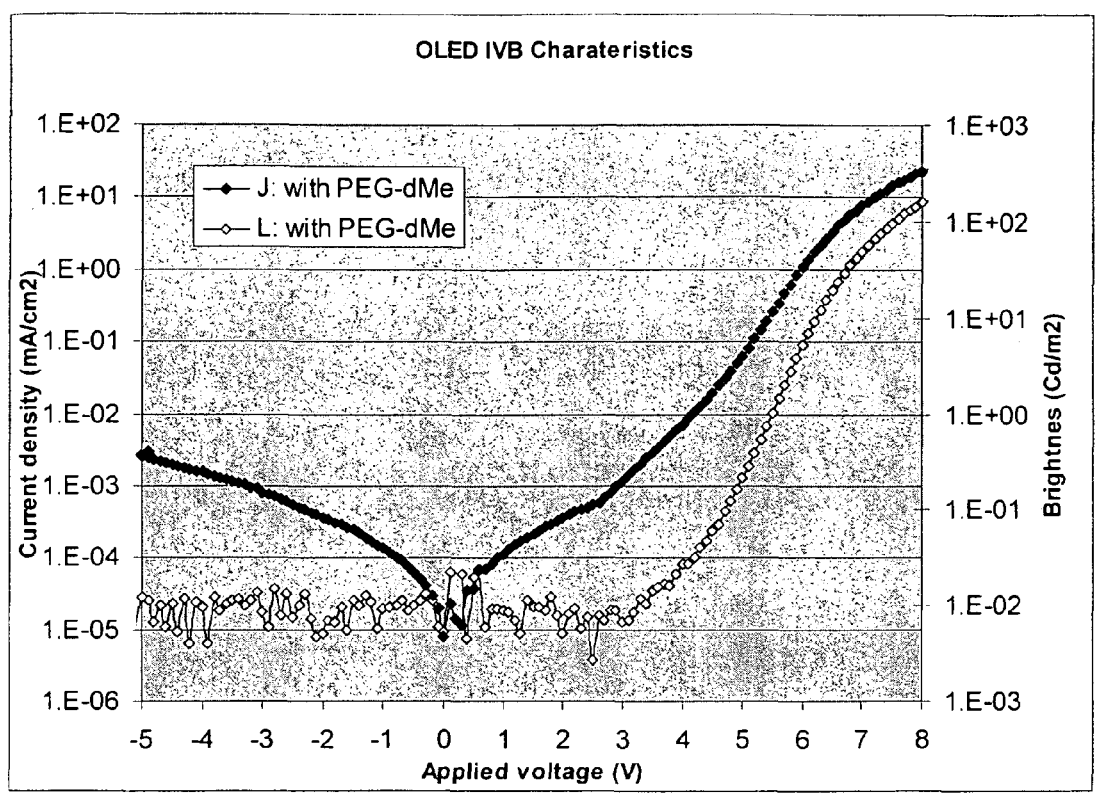
Figure 13C:
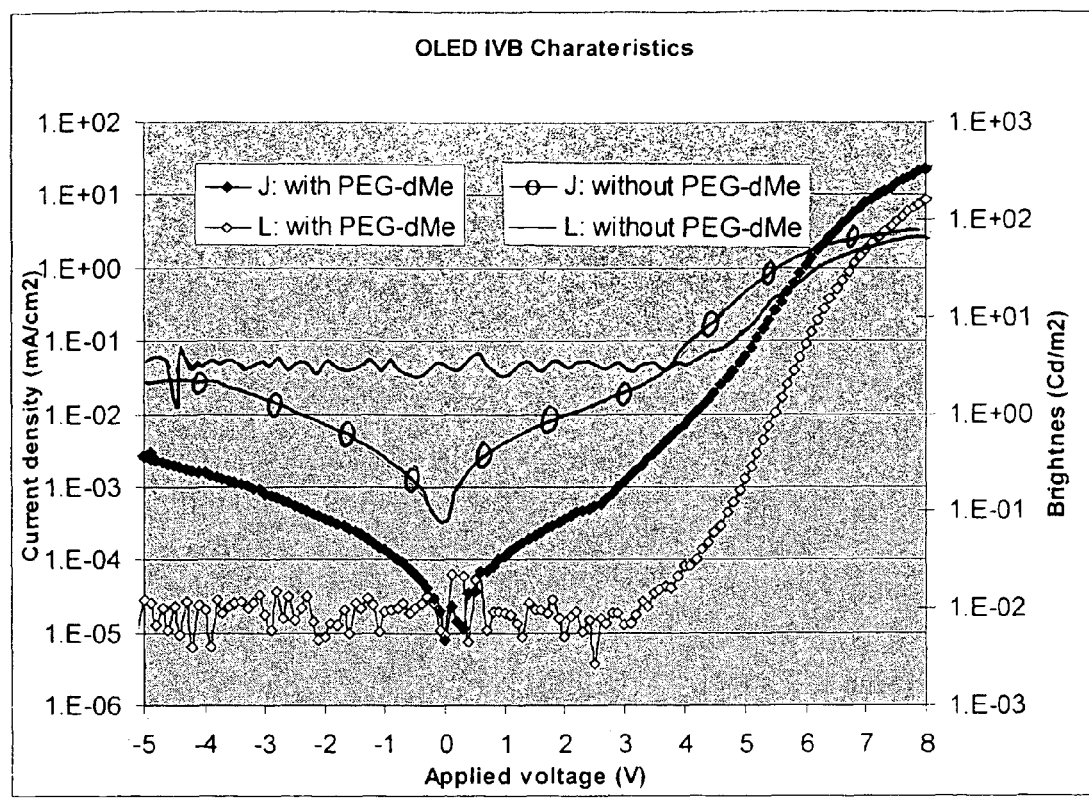

With respect to FIG. 13, FIGS. 13A, 13B, and 13C are graphs demonstrating the effect of adding PEG-dMe. In FIG. 13A, the solid line with "o's" represents the current density (left y-axis) vs. the applied voltage (x-axis); while the solid line without "o' s" represents the device brightness (right y-axis) vs applied voltage. In FIG. 13B, the line of black diamonds represents the current density (left y-axis) vs. the applied voltage x-axis); while the line with white diamonds represents the device brightness (right y-axis) vs applied voltage. As can be seen with reference to FIGS. 13A and 13B, the device using a blend of Ba(acac)$_2$ and polyethylene glycol dimethyl ether (PEG-dMe), e.g., FIG. 13B, has significantly lower turn-on voltage (approximately 3V) than the one using only Ba(acac)2 (approximately 5V), e.g., FIG. 13A. Further, the device using PEG-dMe, e.g., FIG. 13A, also has one order of magnitude lower leakage current (e.g. comparing current densities of FIG. 13A vs FIG. 13B @–3V applied voltage). Additionally, the device using PEG-dMe, e.g., FIG. 13A, has approximately two orders of magnitude higher brightness (e.g. comparing device brightness at ~8V applied voltage) and higher quantum efficiency (not shown in these plots). It is to be noted that Although data of FIGS. 13A and 13B were obtained using proprietary PDA-PBP light-emitting polymer (LEP), similar improvements are also observed for all other commercially available LEPs, such as MEH-PPV, polyfluorene, etc. FIG. 13C depicts the graphs of FIGS. 13A and 13B super imposed on one another. As can be seen with reference to FIG. 13C, at 8 volts applied, J is ~1.e2 greater w/PEG-dME than wo/PEG-dME and L is ~1.e1 greater; turn on voltage w/PEG-dMe is ~3V vs ~5v wo/PEG-dME.

Variations on of the present disclosure will be apparent to those knowledgeable in the field of electroluminescent devices. For example, while the layered structure having a cavity may be formed by ordinary lithographic and etching techniques, other techniques such as laser ablation may also be employed, either as an alternative or in addition, to remove material from the layered structure. The present disclosure also allows the incorporation of known aspects of electroluminescent display device design such as interdigitated electrodes. It should also be noted that additional layers may be formed between each layer to promote interlayer adhesion or to improve electrical properties such as electron and/or hole transport.

One of ordinary skill in the art will also recognize other considerations such as packaging and electronics are also an essential consideration for any display. Reactive metals and luminescent materials used in these displays are subject to attack by moisture and air. Therefore, the displays should be packaged accordingly. Such packaging may involve lamination or other technologies known in the art. Device electronics may include commercially available systems appropriate to any desired display design.

While the disclosure has been described with reference to the specific embodiments thereof, it should be understood by those skilled in the art that various changes may be made and equivalents may be substituted without departing from the true spirit and scope of the disclosure. In addition, many modifications may be made to adapt a particular situation, material, composition of matter, process, process step or steps, to the objective, spirit and scope of the disclosure. All such modifications are intended to be within the scope of the claims appended hereto.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

What is claimed is:

1. A method, comprising the steps of:
   providing a substrate;
   contacting the substrate with an anode layer;
   contacting the anode layer with an electroluminescent material layer; and
   contacting the electroluminescent material layer with an electron-injection layer, wherein the electron-injection layer comprises a polymer composition that in turn comprises a polymer containing polar component, and a metal diketonate;
   wherein the contacting results in the production of the layered structure on the substrate.

2. The method according to claim 1, wherein said polymer containing polar component comprises a member selected from the group consisting of polyethylene glycol dimethyl ether, polymethylene glycol, polymethylene oxide, polyethylene glycol, polyethylene oxide, polypropylene glycol, polypropylene oxide, polybutylene glycol, polybutylene oxide, or one or more derivatives thereof.

3. The method according to claim 1, wherein said polymer containing polar component comprises polyethylene glycol dimethyl ether.

4. The method according to claim 1, wherein said metal diketonate includes a member selected from the group consisting of lithium acetylacetonate, barium acetylacetonate, beryllium acetylacetonate, calcium acetylacetonate, magnesium acetylacetonate, sodium acetylacetonate, potassium acetylacetonate, cesium acetylacetonate, strontium acetylacetonate, boron acetylacetonate, aluminum acetylacetonate, gallium acetylacetonate, indium acetylacetonate, silver acetylacetonate, and alloys thereof.

5. The method according to claim 1, wherein said metal diketonate comprises barium acetylacetonate.

6. The method according to claim 1, wherein said electron-injection layer comprises polyethylene glycol dimethyl ether and barium acetylacetonate.

7. The method according to claim 6, wherein the polyethylene glycol dimethyl ether and barium acetylacetonate are combined prior to contacting the substrate to produce a final product that includes from about 20% to about 60% polyethylene glycol dimethyl ether and about 40% to about 80% barium acetylacetonate.

8. The method according to claim 1, wherein said polymer composition includes a suitable solvent.

9. The method according to claim 8, wherein said suitable solvent comprises 2-ethoxyethanol.

10. The method according to claim 1, wherein the contacting of the electroluminescent material layer with the electron-injection layer comprises a solution deposition method selected from the group consisting of spin-coating, ink-jet printing, screen printing, and roll to roll coating.

11. A substrate comprising a layered structure wherein the layered structure comprises:
   an anode layer;
   an electroluminescent material layer; and
   an electron-injection layer, wherein the electron-injection layer comprises a polymer composition that comprises a polymer containing polar component and a metal diketonate.

12. The substrate according to claim 11, wherein the polymer composition comprises polyethylene glycol dimethyl ether and barium acetylacetonate.

13. The substrate according to claim 11, wherein the substrate is transparent.

14. The substrate according to claim 11, further comprising a cathode layer in contact with said electron-injection layer.

15. The substrate according to claim 11, further comprising a hole-injection layer in contact with said anode layer.

16. The substrate according to claim 11, further comprising a dielectric layer interposed between the anode layer and electron-injection layer.

17. The substrate according to claim 16, further comprising a cavity, wherein the cavity comprises a lumen, which lumen is at least partially filled with the electroluminescent material layer.

18. An electroluminescent device, the device comprising:
   a substrate;
   an anode layer positioned above the substrate;
   an electroluminescent material layer positioned above the anode;
   an electron-injection layer positioned above the electroluminescent layer, wherein the electron-injection layer comprises a polymer composition comprising a polymer that contains a polar component and a metal diketonate; and
   a cathode layer positioned above the electron-injection layer.

19. The electroluminescent device of claim 18, wherein said electron-injection layer comprises polyethylene glycol dimethyl ether and barium acetylacetonate.

20. The electroluminescent device according to claim 18, further comprising a dielectric layer.

21. The electroluminescent device according to claim 20, further comprising a cavity, wherein the cavity comprises a lumen, which lumen is at least partially filled with the electroluminescent material layer.

22. A method for fabricating an electroluminescent device comprising the steps of:
   providing a substrate;
   contacting the substrate with an anode layer;
   contacting the anode layer with an electroluminescent material layer; and
   contacting the electroluminescent material layer with an electron-injection layer, wherein the electron-injection layer comprises polyethylene glycol dimethyl ether and barium acetylacetonate, and wherein the contacting is performed in such a manner that the electroluminescent material layer is in electrical contact with both the anode and electron-injection layers.

23. A method for fabricating an electroluminescent device comprising the steps of:
   providing a substrate;
   contacting the substrate with an anode layer;
   contacting the anode layer with a dielectric layer;
   forming a cavity in the dielectric layer and the anode layer in such a manner that the cavity extends through the dielectric layer and the anode layer, wherein once formed the cavity has an interior cavity surface comprising a dielectric region and an anode region;
   coating the interior cavity surface with an electroluminescent material such that the electroluminescent material is in electrical contact with the anode region and dielectric region of the interior cavity surface so as to form a layered structure; and
   contacting the layered structure with an electron-injection layer, wherein the electron-injection layer comprises polyethylene glycol dimethyl ether and barium acetylacetonate in such a manner that the electron-injection layer is in electrical contact with the electroluminescent material in the cavity.

24. The method according to claim 23, further comprising contacting the layered structure with an cathode layer.

25. The method according to claim 24, wherein said cathode layer comprises Al.

* * * * *